(12) United States Patent
Yoon et al.

(10) Patent No.: US 7,295,479 B2
(45) Date of Patent: Nov. 13, 2007

(54) APPARATUS AND METHOD FOR MANAGING BAD BLOCKS IN A FLASH MEMORY

(75) Inventors: Song-ho Yoon, Bucheon-si (KR); Jang-hwan Kim, Seoul (KR); Bum-soo Kim, Sungnam-si (KR); Tae-sun Chung, Seoul (KR); Ji-hyun In, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 99 days.

(21) Appl. No.: 11/322,317

(22) Filed: Jan. 3, 2006

(65) Prior Publication Data

US 2006/0109725 A1 May 25, 2006

Related U.S. Application Data

(62) Division of application No. 10/817,245, filed on Apr. 5, 2004, now Pat. No. 7,009,896.

(30) Foreign Application Priority Data

Apr. 4, 2003 (KR) .................. 10-2003-0021502
Sep. 9, 2003 (KR) .................. 10-2003-0063342

(51) Int. Cl.
*G11C 29/00* (2006.01)
(52) U.S. Cl. ............ 365/200; 365/185.11; 365/185.33; 365/201
(58) Field of Classification Search ............... 365/200, 365/185.11, 185.33, 201
See application file for complete search history.

(56) References Cited

U.S. PATENT DOCUMENTS 6,000,006 A 12/1999 Bruce et al.
6,260,156 B1 7/2001 Garvin et al.

(Continued)

FOREIGN PATENT DOCUMENTS

CN 1316087 10/2001

(Continued)

OTHER PUBLICATIONS

Chinese Office Action dated Apr. 20, 2007 issued in CN Application No. 20041004364.6.

*Primary Examiner*—Richard T. Elms
*Assistant Examiner*—Pho M. Luu
(74) *Attorney, Agent, or Firm*—Sughrue Mion, PLLC

(57) ABSTRACT

A method and an apparatus for managing bad blocks generated while a flash memory is being used. A method for managing a bad block in a flash memory includes (a) allocating a used area having a plurality of used blocks and a spare area having a plurality of spare blocks in the flash memory, and providing a block map page group including a plurality of block map pages in which mapping information to map a bad block generated in either of the used area or the spare block to a spare block, (b) having mapping information of the block map page reside among the block map page groups in the memory, and (c) mapping the bad block generated during a flash operation to an unused spare block found through the mapping information, updating the mapping information, and recording the updated mapping information on the block map page.

14 Claims, 22 Drawing Sheets

U.S. PATENT DOCUMENTS

| | | | |
|---|---|---|---|
| 6,381,176 B1 * | 4/2002 | Kim et al. | 365/185.11 |
| 2004/0080998 A1 | 4/2004 | Chang et al. | |
| 2007/0081401 A1 * | 4/2007 | Chen | 365/200 |

FOREIGN PATENT DOCUMENTS

| | | |
|---|---|---|
| EP | 0 548 564 A2 | 6/1993 |
| EP | 0548564 A | 6/1993 |
| JP | 3-141447 A | 6/1991 |
| JP | 3-273349 A | 12/1991 |
| JP | 7-201190 A | 8/1995 |
| JP | 2002-285001 A | 10/2000 |
| JP | 2001-350673 A | 12/2001 |
| JP | 2003-44231 A | 2/2003 |
| JP | 2003-58431 A | 2/2003 |

* cited by examiner

APPARATUS AND METHOD FOR MANAGING BAD BLOCKS IN A FLASH MEMORY

This is a divisional of application Ser. No. 10/817,245 filed Apr. 5, 2004 now U.S. Pat. No. 7,009,896. The entire disclosure(s) of the prior application(s), application Ser. No.(s) 10/817,245 is hereby incorporated by reference.

BACKGROUND OF THE INVENTION

This application claims priorities of Korean Patent Application Nos. 10-2003-0021502 and 10-2003-0063342 filed on Apr. 4, 2003, and Sep. 9, 2003, respectively in the Korean Intellectual Property Office, the contents of which are incorporated herein by reference.

1. Field of the Invention

Apparatuses and methods consistent with the present invention relate to managing bad blocks generated while a flash memory is being used. More particularly, the present invention relates to a method for managing bad blocks in a flash memory to thereby minimize flash operations. Further, the present invention is directed to a method and an apparatus for protecting important information stored in the flash memory from unauthorized flash operations by a non-authenticated flash application, by establishing a certain area of the flash memory as a protected area and managing the protected area.

2. Description of the Related Art

A flash memory is a device for storing data therein, such as a RAM (random access memory), a ROM (read only memory) or a hard disk. The flash memory has a plurality of blocks and an erase operation is performed on a block basis.

Each block of the flash memory is limited in the number of times the data therein can be erased. Thus, if the number of times a block of the flash memory has been erased exceeds the limited number of erasures as predetermined when it was manufactured at a factory, the concerned block turns bad. In addition, as the number of erasures of a block having a bad physical property approaches the limited number of erasures, the concerned block turns bad. A flash memory such as NAND flash memory may be manufactured with some bad blocks. Taking this into consideration, the manufacturer directs users how to find the bad blocks therein. When a read operation is performed in a block of a flash memory, different data from the data previously written in the block of the flash memory may be read, and at this time, the concerned block also turns bad. These bad blocks may be generated from any of the blocks while the flash memory is in use, or they may have existed even before the flash memory is used. Existence of the bad blocks may cause troubles when using the flash memory.

To manage the bad blocks, management information for the bad blocks is needed. This management information may be stored in separate memories such as a RAM or an EEPROM. However, when the management information is stored in the RAM, the information stored in the RAM may be entirely lost if the power supply is suspended or terminated. When the management information is stored in a separate memory such as EEPROM, the cost to construct a system, therefore, increases, and the system is accordingly complicated.

To solve these problems, U.S. Pat. No. 6,260,156 discloses a method for managing bad blocks in a flash memory system, wherein a certain area in the flash memory is allotted for the management of bad blocks.

FIG. 1 is a block diagram illustrating a structure of a chunk as a basic unit for management of bad blocks. Referring to the prior art, a flash memory area is divided into a data area and a spare area, wherein the data area is used to write and erase actual data and the spare area is to manage bad blocks if generated, being classified into plural chunks. The chunk illustrated in FIG. 1 comprises (y+1) spare blocks (#0 to #y). In each chunk, an original chunk map is stored in a space whose memory address is higher and a copy chunk map is stored in each of the spare blocks. There exists a working chunk map in a RAM, a volatile memory.

FIG. 2 illustrates an enlarged spare block #0 to show a full structure of the chunk. Referring to this figure, an original chunk map and a copy chunk map in a flash memory and a working chunk map in a RAM all have the same data structure. First, meta information to manage the bad blocks, for example, the number of total blocks, the size of chunk map or the state of chunk map and the like, is stored a bad block management header (BBM header). There are (y+1) BBM entries as many as (y+1) spare blocks, and a BBM entry comprises a valid field and a bad data block number. An entry stores therein information for mapping a bad block into a spare block to replace the bad block. For example, if the bad data block number in the entry #7 is 10, this indicates that the bad block numbered 10 is remapped in the spare block #7 of the n-th chunk.

The conventional mapping is done as follows. A bad block manager is initialized through a formatting of the bad block manager, formatting a chunk and mounting of the chunk. Initialization of the bad block manager is completed when the chunk has been mounted. In the mounting of the chunk, a copy chunk map and an original chunk map of a flash memory are read and a working chunk map is generated in a RAM. At this time, both the copy chunk map and the original chunk map are maintained in the flash memory, whereby data can be recovered notwithstanding any error generated in the course of a variety of operations. When the initialization of the bad block manager is completed, the chunk is in the Ready state. To approach a specific block, it is inspected whether any block requested for each chunk exists in an entry and, if such a block exists, remapping is done. To summarize an algorithm when a new bad block is found, an available but unused entry is first found, a chunk map containing the entry is read and it is written onto the working chunk map. Then, new mapping information is written onto the unused entry from which the working chunk map is found. Subsequently, the changed remapping information is recorded in the original chunk map and the copy chunk map of the flash memory.

The conventional mapping art described above performs write and erase operations several times in a flash memory so as to maintain consistency between the copy chunk map and the original chunk map of the flash memory and the working chunk map in the RAM. For example, when a new bad block involved in an execution time is generated, the following operations are needed.

1. An erase operation to erase an original chunk map block,

2. A write operation to write an original chunk map on the original chunk map block, 3. A write operation to write a state of the original chunk map block as "Invalid,"

4. An erase operation to erase a copy chunk map block,

5. A write operation to write a copy chunk map on the copy chunk map block,

6. A write operation to write a state of the original chunk map block as "Valid."

Two erase operations and four write operations are done in a flash memory. Further, since mapping information of bad blocks and spare blocks are stored in plural chunks, a complicated algorithm mounting each chunk should be run to manage the bad blocks and maintain consistency among chunk maps existing in the chunks. In this view, it is necessary not to increase the number of flash operations although bad blocks involved in execution time are generated.

The flash memory has generally been used as a storage device for data only, but its use has recently been extended to store data such as operating system (OS) ROM images or boot loaders which are in need of being protected. Since data such as OS ROM images or boot loaders plays an important role in a system operation, it is necessary to protect an area containing the data from erasure or write operations which may be caused due to unauthorized operation of a flash memory-related software or a user's error. In other words, a certain area of the flash memory needs to be set to a read-only area and to be managed. Even a flash memory with an established read-only area needs a method to replace bad blocks which have been generated or will be generated within the area. In this regard, the flash memory also needs to set new blocks to replace bad blocks as a read-only block and manage them.

SUMMARY OF THE INVENTION

To meet the needs described above, the present invention is conceived. An aspect of the present invention is to provide a method and an apparatus for managing a bad area in a flash memory, when generated, with a small number of flash operations.

Another aspect of the present invention is to provide a method and an apparatus for managing a certain area of a flash memory as a protected area so as to prevent any data in the certain area of the flash memory from being changed by a unauthorized operation of a flash memory-related software.

Still another aspect of the present invention is a method and an apparatus for managing bad blocks generated in a certain area of a flash memory although the certain area is under protection as a read-only area.

According to an exemplary embodiment of the present invention, there is a method for managing a bad block in a flash memory, comprising (a) allocating a used area having a plurality of used blocks and a spare area having a plurality of spare blocks to the flash memory, and providing a block map page group including a plurality of block map pages in which mapping information to map a bad block generated in either of the used area or the spare block into a spare block to replace it, is disposed (b) having mapping information of the block map page selected by a predetermined rule reside among the block map page groups in the memory as resident mapping information, and (c) mapping the bad block generated during a flash operation into an unused spare block found through the resident mapping information, updating the resident mapping information, and recording the updated mapping information on the block map page belonging to the block map page.

Step (a) may comprise (a1) allocating a used area having a plurality of used blocks and a spare area having a plurality of spare blocks to the flash memory, (a2) generating block map fields on each of the spare blocks, on which mapping information between the generated spare blocks and the bad blocks are to be generated, and initializing block map information containing the generated block map fields, a count field for determining time of the mapping information and a transition field for determining validity of the information, (a3) generating block map information by recording mapping information between bad blocks found through inspection of bad blocks existing in the flash memory and spare blocks to replace the found bad blocks and initially mounting the mapping information on the count field, and (a4) recording the block map information on any one of the block map pages belonging to the block map page. In an exemplary embodiment, the spare area may comprise at least two spare blocks, the flash memory may comprise a plurality of chips and each of the steps is performed for each chip. In step (a), at least a part of the used blocks and the spare blocks may be designated as a protected area so as to block an unauthenticated software from accessing the protected area.

In step (b), a valid block map page having the valid latest information-written block page may be examined among the block map pages within the block map page group and mapping information of the found block map page resides in the memory. When the latest information-written block map page is examined, the examination may be made based on the value recorded on the transition field of each block map page and the size of the number recorded on the count field. The method may further comprises recovering a read bad block discovered through a predetermined method, where an invalid block map page indicated with a read error is discovered while a valid block map page having the latest block map page is inspected among the block map pages belonging to the block map page group. When the flash memory comprises a plurality of chips, each of the steps is, in an exemplary embodiment, performed for each chip.

Step (c) may comprise (c1) locating an unused spare block by use of the resident mapping information, (c2) updating the resident mapping information by mapping the number of the unused spare block found through step (c1) with that of the bad block, (c3) locating an unused block map page of the block map page group, (c4) copying information recorded on the generated bad block on the found unused spare block, (c5) recording information including the updated mapping information on the found unused block map page, and (c5) indicating the unused block map page that it is valid. The method may further comprise changing the protected area to be in a readable and writable state when the bad block is generated in the protected area and again changing the protected area to be in read-only state after completion of step (c6). When the flash memory comprises a plurality of chips, each of the steps is, in an exemplary embodiment, performed for each chip.

Step (c) may comprise (c1) determining whether the bad block generated in the step (c) is a read bad block, (c2) erasing a spare block used temporarily to recover the read bad block, (c3) correcting an error of the read bad block and then copying it onto the spare block, (c4) locating an unused block map page among the block map page groups, (c5) indicating on the found block map page that mapping information between the read bad block and the spare block is in recovery from a read error, (c6) erasing the read bad block, (c7) copying the spare block on the erased read bad block, and (c8) indicating on the found block map page that it is invalid. The protected area may be changed to be in a readable and writable state when the bad block is generated in the protected area and the protected area is again changed to be in read-only state after completion of step (c8).

According to another exemplary embodiment of the present invention, there is provided an apparatus for managing a bad block in a flash memory constructed with at least one or more flash memory chips, comprising a flash memory having a used area having plural used blocks and a spare area to replace a bad block generated during use, and having within the spare area a block map page group having plural block map pages in which mapping information between the bad block generated during use and a spare block to replace it, a memory for loading a flash device manger which defines mapping information of the latest valid block map page existing within the block map page group and a process handling a bad block when generated, and a central processing unit (CPU) electrically interconnected to the flash memory and the memory, managing a flash operation in the flash memory and for the bad block by reading out a code of the flash device manger. The block map page group may comprise at least two or more spare blocks.

The apparatus may further comprises a flash memory controller electrically interconnected between the CPU and the flash memory and having two or more buffers storing therein data for doing a next operation to the flash memory while the CPU is doing a flash operation. The flash memory controller may establish a predetermined area of the flash memory as a protected area and allows a flash operation to the protected area only for the flash application authenticated by the flash device manager and allows no flash operation in the protected area for the flash application not authenticated by the flash device manager, and when the flash memory comprises plural flash memory chips, the used area, the spare area and the block map page group within the spare area of the flash memory exist in each of the flash memory chips.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION OF THE INVENTION

Other features and advantages of other exemplary embodiments of the invention and any method to accomplish them are incorporated into the following more detailed description and the accompanying drawings. However, the present invention shall not be limited to the exemplary embodiments described herein. Hereunder, exemplary embodiments of the present invention will be described in detail with reference to the accompanying drawings.

Figure 3:
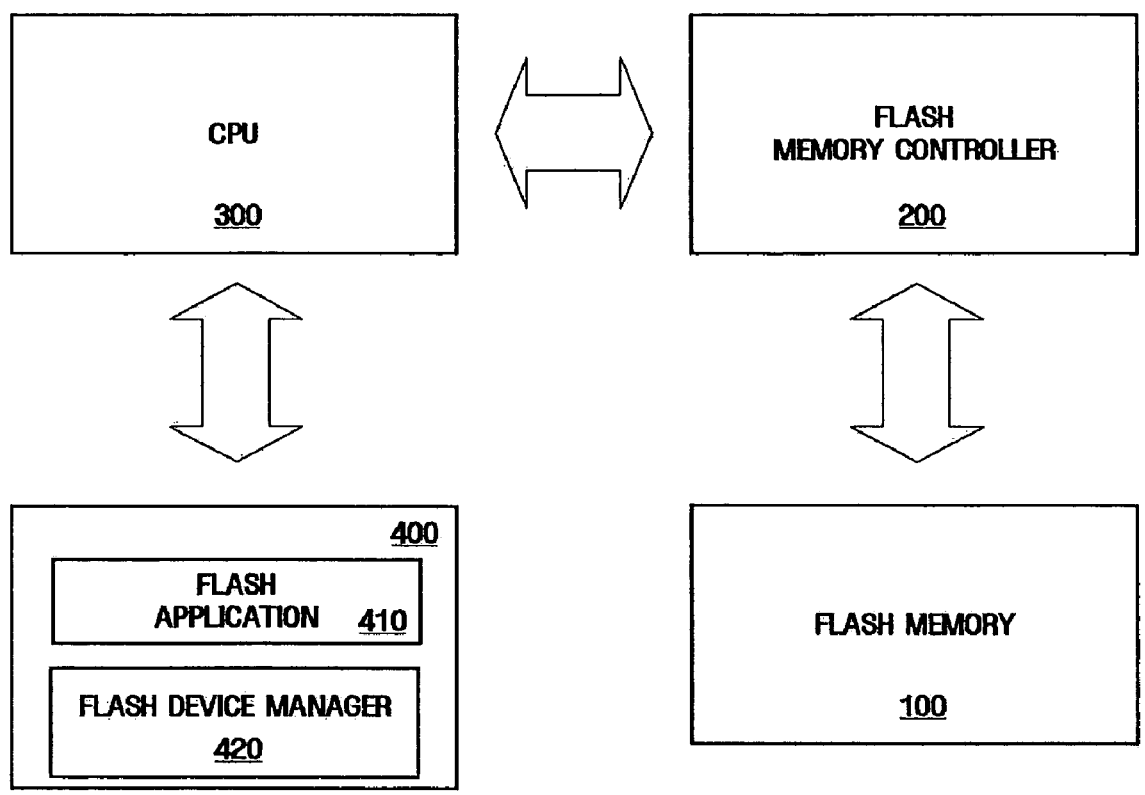
FIG. 3 is a block diagram schematically illustrating elements of the system according to an exemplary embodiment of the present invention.
Figure 4:
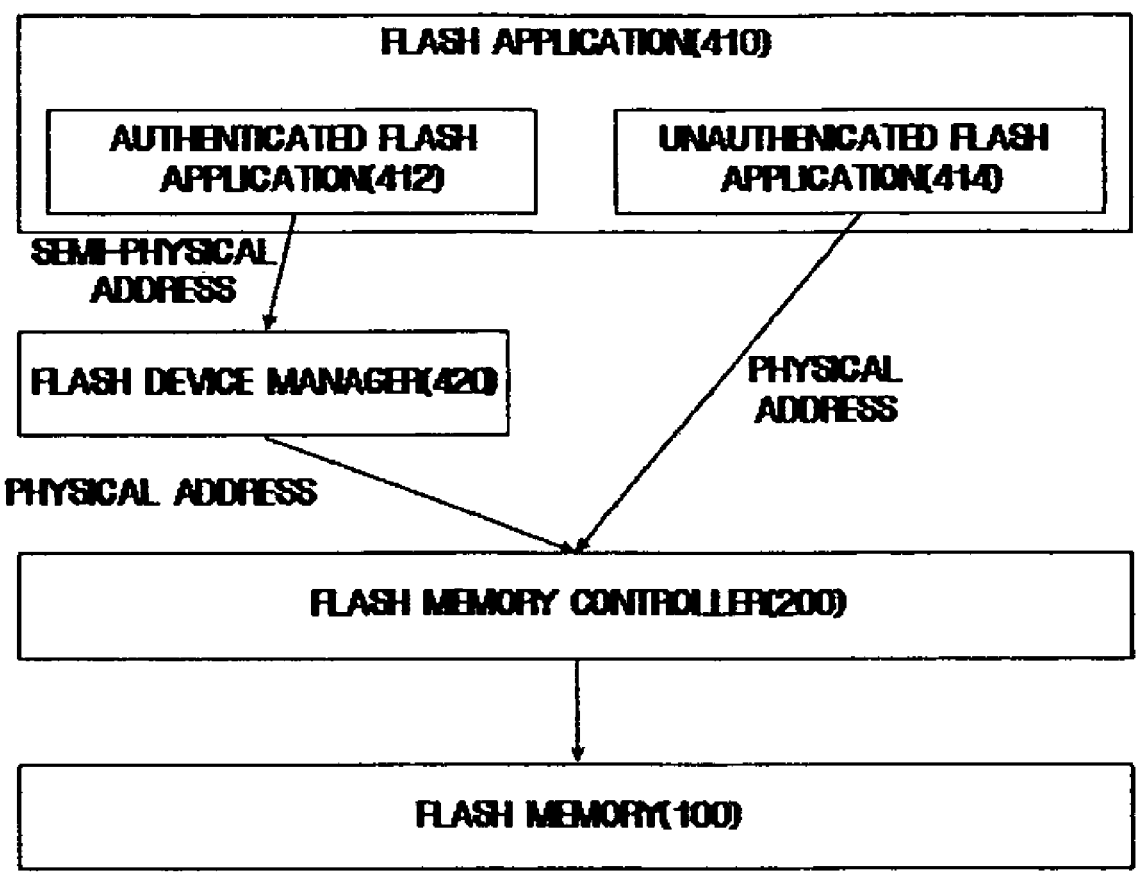
FIG. 4 is a block diagram illustrating an operation of the system in FIG. 3.

FIG. 3 is a block diagram schematically illustrating elements of a system according to an exemplary embodiment of the present invention, and FIG. 4 is a block diagram illustrating an operation of the system in FIG. 3.

A system according to an exemplary embodiment of the present invention comprises a flash memory 100, a flash memory controller 200, a central processing unit (CPU) 300 and an XIP-able (execute-in-place) memory 400. The XIP-able memory 400 refers to a memory capable of executing software therein, like a RAM (hereinafter referred to as "main memory").

The CPU 300 can write, read or erase any necessary information in the flash memory 100 by use of a flash application 410 and a flash device manager 420 residing in the main memory 400 (hereinafter referred to as "flash operation"), and an erase operation is to be done on a block basis.

In the system with the flash memory controller 200 as shown in FIG. 3, the flash application 410 accesses the flash memory 100 through the flash memory controller 200. Currently in the flash memory 100, the speed of write operation is slower than that of read operation by about 20 times to 1000 times. The flash memory controller 200 can increase the speed of write or read operation. For increasing the speed, two or more buffers for write or read operations are positioned inside the flash memory controller 200. While the CPU 300 is inputting data into or outputting data through one buffer of the flash memory controller 200, the flash memory controller 200 outputs or inputs data through another buffer into the flash memory 100, thereby allowing the flash memory controller 200 to increase data input/output speed from the CPU 300 to the flash memory 100.

When the flash application 410 approaches the flash memory controller 200 to use the flash memory 100, the flash memory controller 200 sets a certain area of the flash memory 100 as a read-only area whereby data can be protected from an unauthorized flash operation or an unintended flash operation of the flash application 410. To use the read-only area, the flash memory controller 200 certifies whether the flash application 412 is authenticated and only the authenticated flash application 412 certified by the flash memory controller 200 is authorized to approach the read-only area of the flash memory 100 and conduct write and erase operations. Since the unauthenticated flash application 414 not certified by the flash memory controller 200 is not authorized to approach the read-only area, it cannot conduct write and erase operations.

It is not easy to control a flash memory which can be controlled through an I/O bus interface, like a NAND flash memory, or connect it to a memory bus interface of the CPU 300. Thus, the flash memory controller 200 is interposed between the flash memory 100 and the CPU 300, each having an I/O bus interface, so as to help different bus interfaces to be interconnected, thereby making it easy to use the flash memory 100. The flash memory controller 200 provides several functions including management of a certain area of the flash memory 100 as a read-only area or enhancement of the flash operation capability. However, the system may be realized only with the CPU 300, the main memory 400 and the flash memory 100, without the flash memory controller 200.

The flash device manager 420 and the flash application 410 may reside in the main memory 400. The flash device manager 420 is a software module to define all the processes for managing bad blocks generated while the flash application 410 is using the flash memory 100, residing in the main memory 400, and it manages the bad blocks by allowing the CPU 300 to execute codes of the flash device manager 420. The flash application 410 may be classified into an authenticated flash application 412 and an unauthenticated flash application 414. The authenticated flash application 412 is an upper layer using the flash device manger 420, doing no unauthorized operation to intentionally destroy data in the flash memory. The flash application 412 may comprise a boot loader, a flash translation layer, a file system, etc. The unauthenticated flash application 414 may comprise a virus program or a hacking program created by a hacker and the like in order to operate the system abnormally, to perform an unauthorized operation to intentionally destroy data of the flash memory. The flash device manger 420 authorizes the authenticated flash application 412 to use the flash memory 100.

FIG. 4 illustrates a correlation between a semi-physical address and a physical address interposed between the flash device manger 420 and a flash memory control 200. The authenticated flash application 412 requests the flash device manager 420 to do a flash operation on the area of the semi-physical address and then the flash device manager 420 converts the semi-physical address into the physical address and carries out a flash operation on the area of the physical address in the flash memory controller 100. The semi-physical address and the physical address may be expressed as (block number *block size+offset of blocks). The offset of blocks is equal to or larger than 0 and is less than the block size.

In the semi-physical address, the block number always refers to one of used block numbers in a used area 110. However, in the physical address, the block number may refer to one of the spare block numbers in a spare area when one of used blocks in the used area 120 is a bad block. In most cases, the semi-physical address and the physical address are of the same, but they may be different when some of the used blocks are bad blocks.

The unauthenticated flash application 414 may approach the flash memory controller 200 not through the flash device manager 420. However, when the unauthenticated flash application 414 intends to do a flash operation on the protected area 130, the flash memory controller 200 verifies whether the unauthenticated flash application 414 is an authenticated application or not. Since it is an unauthenticated application, the flash operation by the unauthenticated flash application 414 is not permitted.

Figure 5:
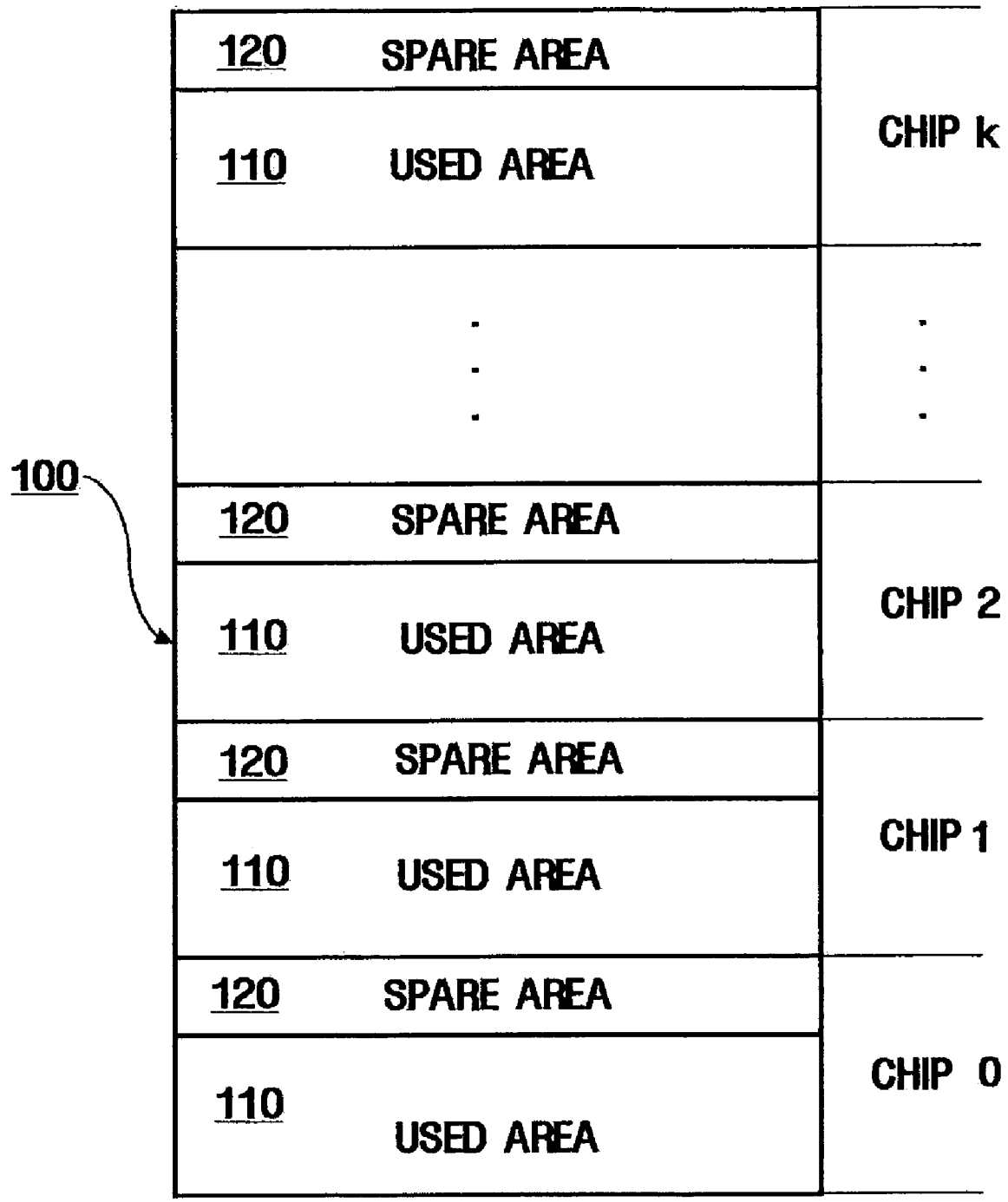
FIG. 5 is a block diagram illustrating a flash memory constructed with (k+1) chips.

FIG. 5 is a block diagram illustrating a flash memory constructed with (k+1) chips. The flash memory 100 can be realized with (k+1) flash memory chips, wherein each memory chip may have a used area 110 and a spare area for bad block management. In an embodiment of the present invention, the spare area for bad block management may be gathered in one or more specific chips, for example, a chip #0, a chip #1 or a chip #3. In other embodiments of the present invention, each chip is given a spare area 120 whereby the scope of examining the existence or the non-existence of bad blocks for every flash operation is limited to one chip, thereby enhancing the performance of the flash operation. The size of a spare area 120 is determined to be an addition corresponding to the maximum number of bad blocks which may be generated in each chip and the number of blocks required for managing the bad blocks. The number of blocks required in the spare area 120 will be determined in the following manner.

Figure 6:
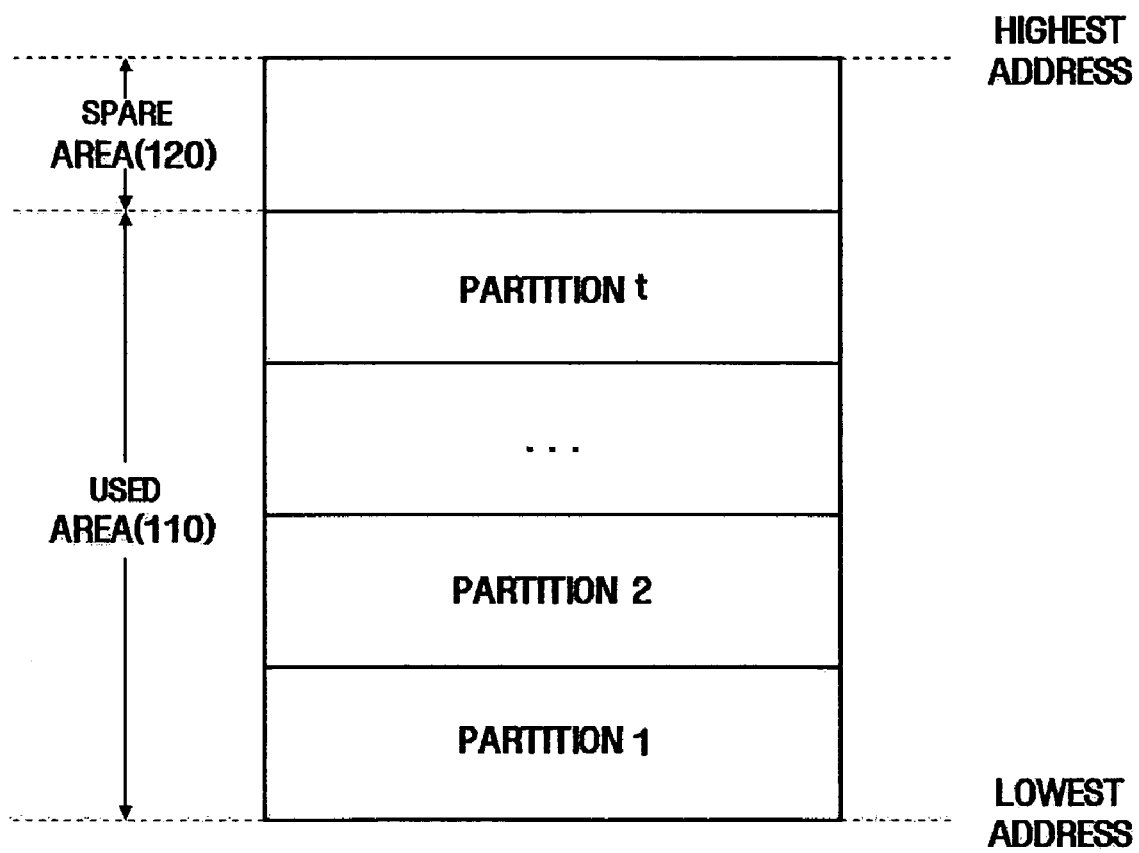
FIG. 6 is a block diagram illustrating a structure of a chip of the flash memory partitioned into t used areas and one spare area.

FIG. 6 is a block diagram illustrating a structure of a chip of the flash memory partitioned into t used areas and one spare area. To store boot loader images, OS ROM images or file system data in the flash memory, the flash memory may be partitioned into plural areas for individual uses, and the partitioned area is called a partition. Each partition has a partition management software and each software management software manages globally the bad blocks which may be generated in its own partition through the flash device manger 420. The partition management software is an authenticated flash application 412, which may comprise a boot loader, an OS, a file system and so on. Although the lower addresses of any concerned chip are allocated to the used area 110 and the spare area 120 is allocated in a place which not used by the used area 110, this sequence of allocating the used and the spare areas may be reversed. At this time, the used area 110 may be partitioned into t partitions. The number of partitions (t) and the size thereof may be determined depending upon kind and amount of information stored in the flash memory.

Figure 7:
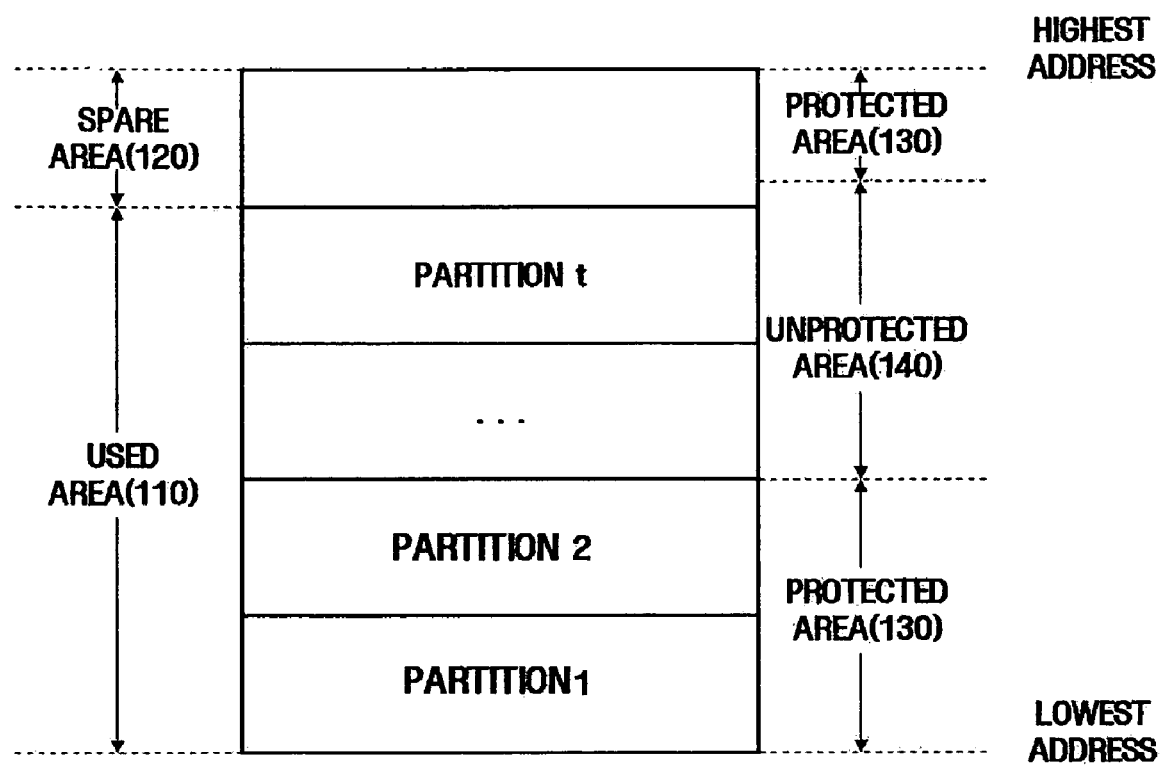
FIG. 7 is a block diagram illustrating of a chip of the flash memory comprising both a protected area and a unprotected area.

FIG. 7 is a block diagram illustrating of a chip of the flash memory comprising both a protected area and an unprotected area. If the certain area of the flash memory can be set to a read-only area (a protected area) inherently in the flash memory 100 or by the flash memory controller 200, the used area 110 and the spare area 120 of the concerned chip as configured in FIG. 7 may be divided into a protected area 130 and a unprotected area 140. In the protected area 130, the flash operation is only allowed for an authenticated flash application 412 but it is not allowed for an unauthenticated flash application 414. Namely, the protected area 130 is an area on which data to be specially protected such as OS ROM images or a boot loader are recorded. To access the protected area 130, the flash application has to pass through an authentication process thereof. Determination as to whether the flash application has been authenticated may be made depending upon existence of any specific code for the authentication. In other words, as for a flash application having a specific code, the flash device manager 420 can request the flash memory controller 200 to permit access for the flash application. Besides, such an authentication may be realized through several different methods. The unprotected area 140 refers to an area where the flash application 410 is allowed to read, write and erase data. The unprotected area 140 shown in FIG. 7 may be extended to cover a portion of the used area 110 and a portion of the spare area 120. The lower addresses are sequentially allocated to the protected and used area, the unprotected and used area, the unprotected spare area and the protected spare area. This sequence may be reversed.

Figure 8:
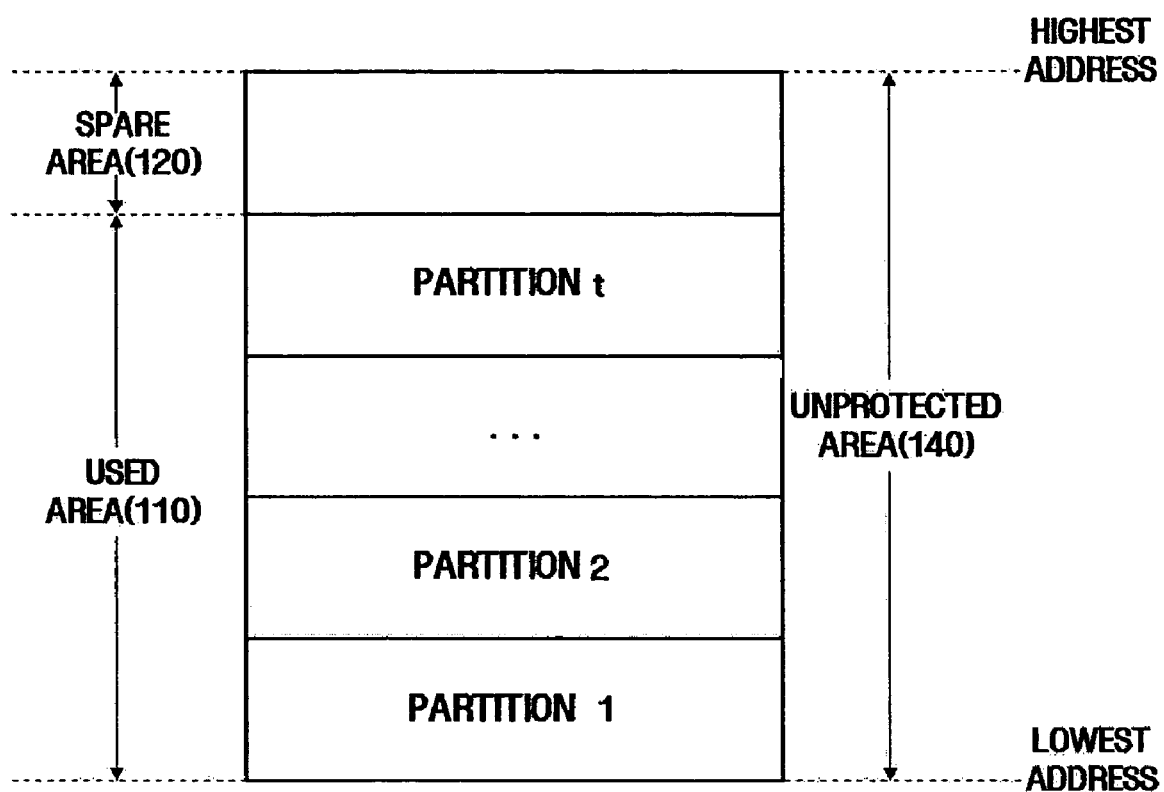
FIG. 8 is a block diagram illustrating of a chip of the flash memory, the whole area of which is not protected.

FIG. 8 is a block diagram illustrating of a chip of the flash memory, the whole area of which is not protected. When there are no data to be protected for a special purpose, such as OS ROM images or a boot loader, the entire area may be set as the unprotected area 140. In this case, flash operations are allowed for all the partitions therein.

Figure 9:
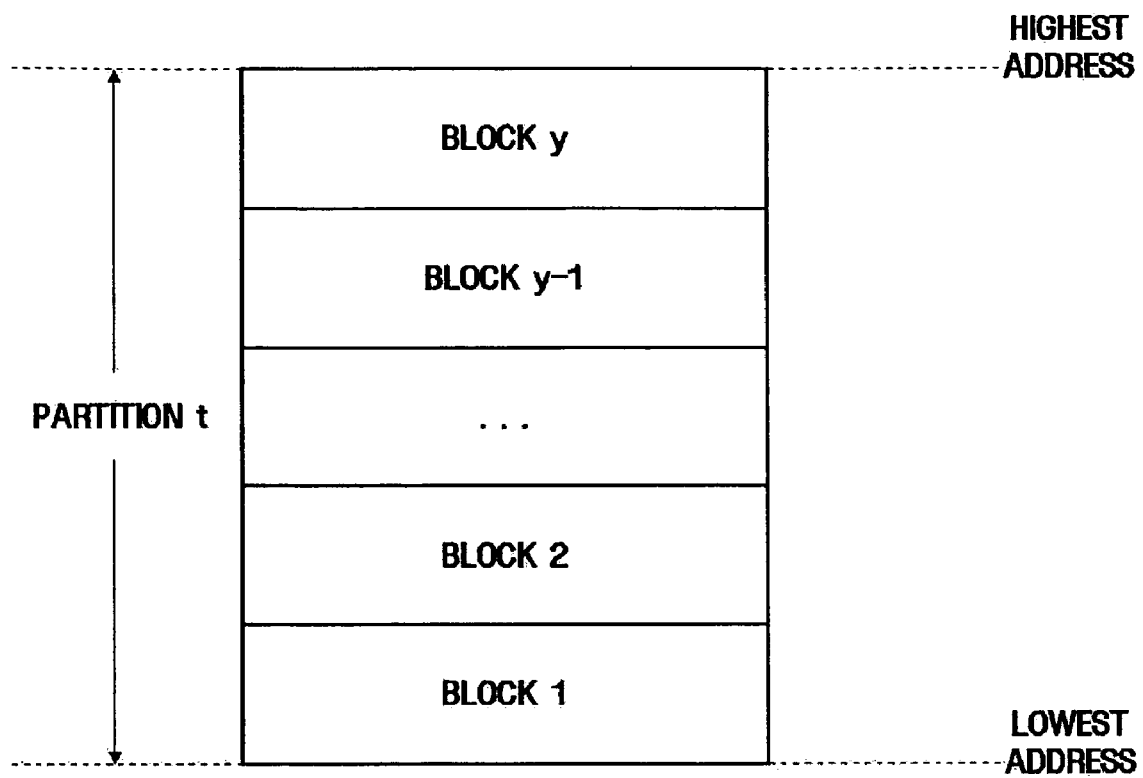
FIG. 9 is a block diagram illustrating of a structure of a partition partitioned into y blocks.

FIG. 9 is a block diagram illustrating of a structure of a partition partitioned into y blocks. A block is a unit for an erase operation in a flash memory. If a block has an error in any bit, the concerned block becomes a bad block. The bad block may be generated in the used area 110 and also in the spare area 120.

Figure 10:
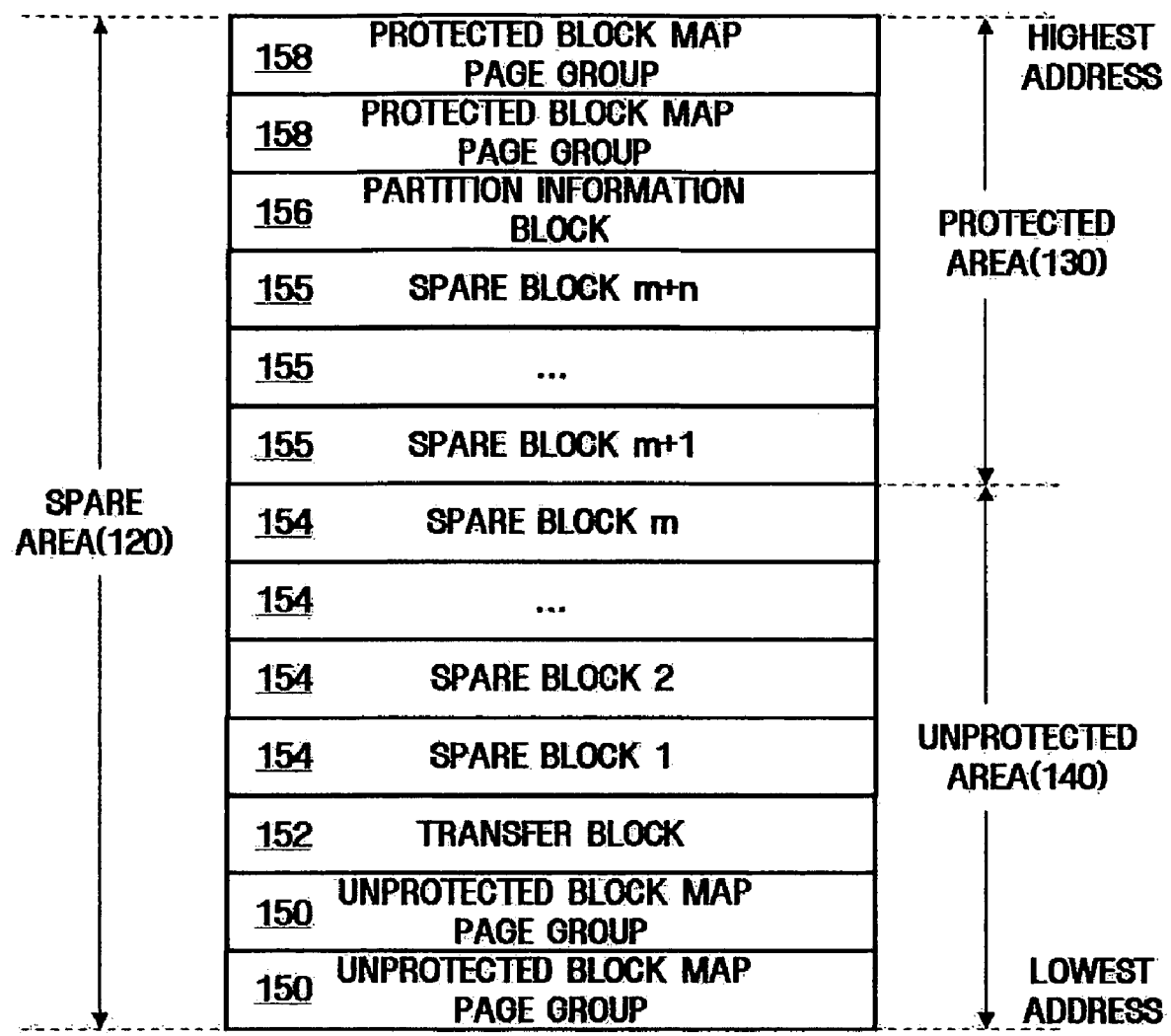
FIG. 10 is a block diagram illustrating a spare area comprising both a protected area and a unprotected area.

FIG. 10 is a block diagram illustrating a spare area comprising both a protected area and an unprotected area. Referring to this figure, the spare area 120 comprises a total of (m+n) spare blocks, calculated from an addition of m spare blocks 154 to replace bad blocks in the unprotected area 140 and n spare blocks 144 to replace bad blocks in the protected area 130, a unprotected or protected block map page group 150 or 158 containing information to map bad blocks in the used area 110 or in the spare area 120 to unprotected or protected spare blocks 154 or 155 to replace them, a transfer block 152 which is a single spare block designated so as to manage any error in a read operation, and a partition information block 156 containing partition information. The sizes of n and m can be fixed but they may also be changeable. For example, when the sum of m and n is 100, m equals 100 and n equals 0 if no error is generated in the protected block and errors are consecutively generated 100 times in the unprotected block.

Conceptually, a block map page group comprises a unprotected block map page group 150 and a protected block map page group 158, wherein the unprotected block map page group 150 contains information to map bad blocks of the unprotected area 140 within the used area 110 and the spare area 120 to the spare blocks 154 to replace them, and the protected block map page group 158 containing information to map bad blocks of the protected area 130 within the used area 110 and the spare area 120 to the spare blocks 155 to replace them. In an exemplary embodiment, the unprotected block map page group 150 and the protected block map page group 158 respectively have two blocks, which will be described later. Without discriminating the unprotected block map page group 150 and the protected block map page group 150, a single block map page group may be used. Also in this case, the block map page group in an exemplary embodiment, comprises two blocks.

The partition information block 156 is a block to contain therein information on partitions of a chip, and thus, when the partition information is not stored in the flash memory, the partition information block 156 will not be allocated to the spare block 120.

The transfer block 152 is a block used to recover any block in which a read error is generated. When a read error is generated in the flash memory, the flash memory may be able to be reused after making an erase operation. So, a transfer block may be used to reuse the block in which a read error is generated. Where the read error is treated equivalently to a write error and an erase error, the bad blocks in which read errors are generated can be replaced with the spare blocks, in this case, and there is no need for the transfer block 152.

The block map page group 150 or 158, the transfer block 152 and the partition information block 146 should be allocated to valid blocks, not to bad blocks. Generally, the flash memory currently available in commerce can perform erase operations about 10,000 to 100,000 times and the total number of blocks in a flash chip is approximately less than 10,000. The percentage of bad blocks that can be generated during the use of a flash memory chip with respect to the total number of blocks is a several percent. When any bad block is generated, an erase operation can be made in the block map page group 150 or 158 or in the transfer block 152. At this time, the total number of erase operations may be equal to or less than the number of bad blocks which can be generated in the flash memory. For this reason, there is the least likelihood that blocks allocated for the block map page group 150 or 158 or the transfer block 152 become bad blocks, and therefore, it is sufficient to initially allocate the block map page group 150 or 158, the transfer block 152 or the partition information block 156 to valid blocks, not to bad blocks, in order to provide for any errors therein.

Figure 11:
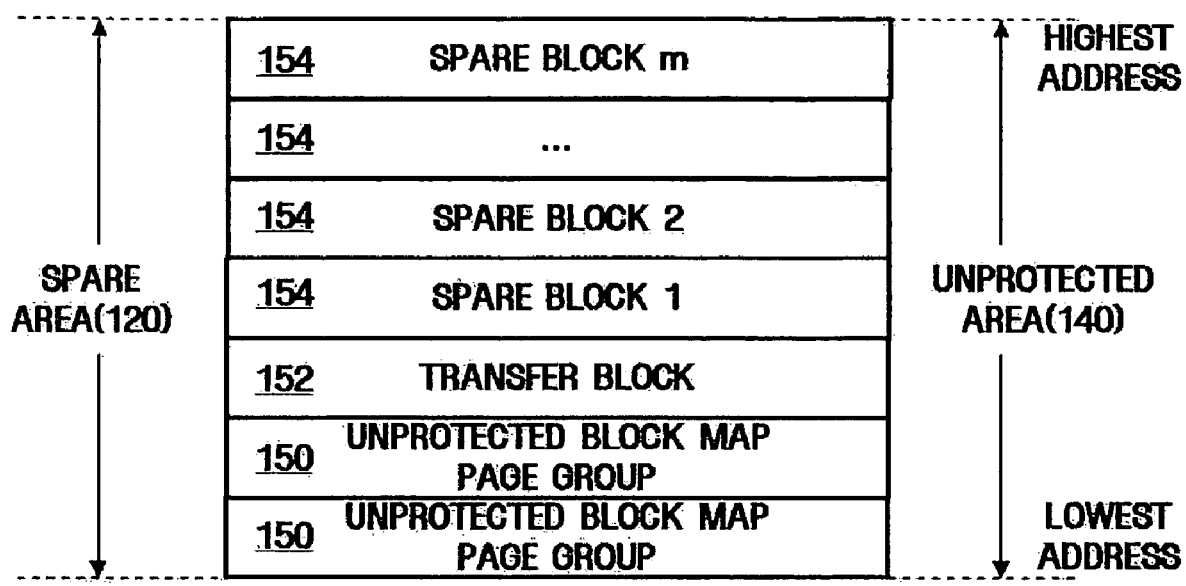
FIG. 11 is a block diagram illustrating a structure of a spare area, the whole area of which is not protected.
Figure 12:
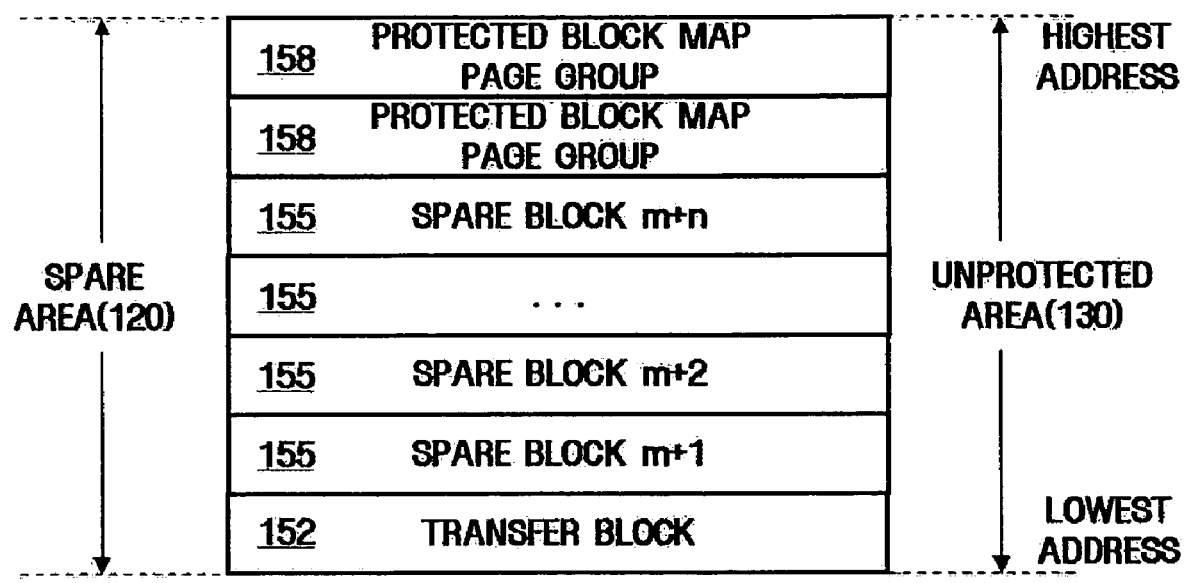
FIG. 12 is a block diagram illustrating a structure of a spare area, the whole area of which is protected.

FIG. 11 is a block diagram illustrating a structure of a spare area, the whole area of which is not protected. At this time, n equals 0 and m equals the maximum number of bad blocks when the capability of a flash memory is guaranteed at a maximum notwithstanding the generation of errors during the use of the flash memory. FIG. 12 is a block diagram illustrating a structure of a spare area, the whole area of which is protected. In FIG. 12, the used area 110 is the protected area 130, wherein m equals 0 and n equals the maximum number of bad blocks when the capability of a flash memory is guaranteed at maximum notwithstanding generation of errors during the use of the flash memory.

Figure 13:
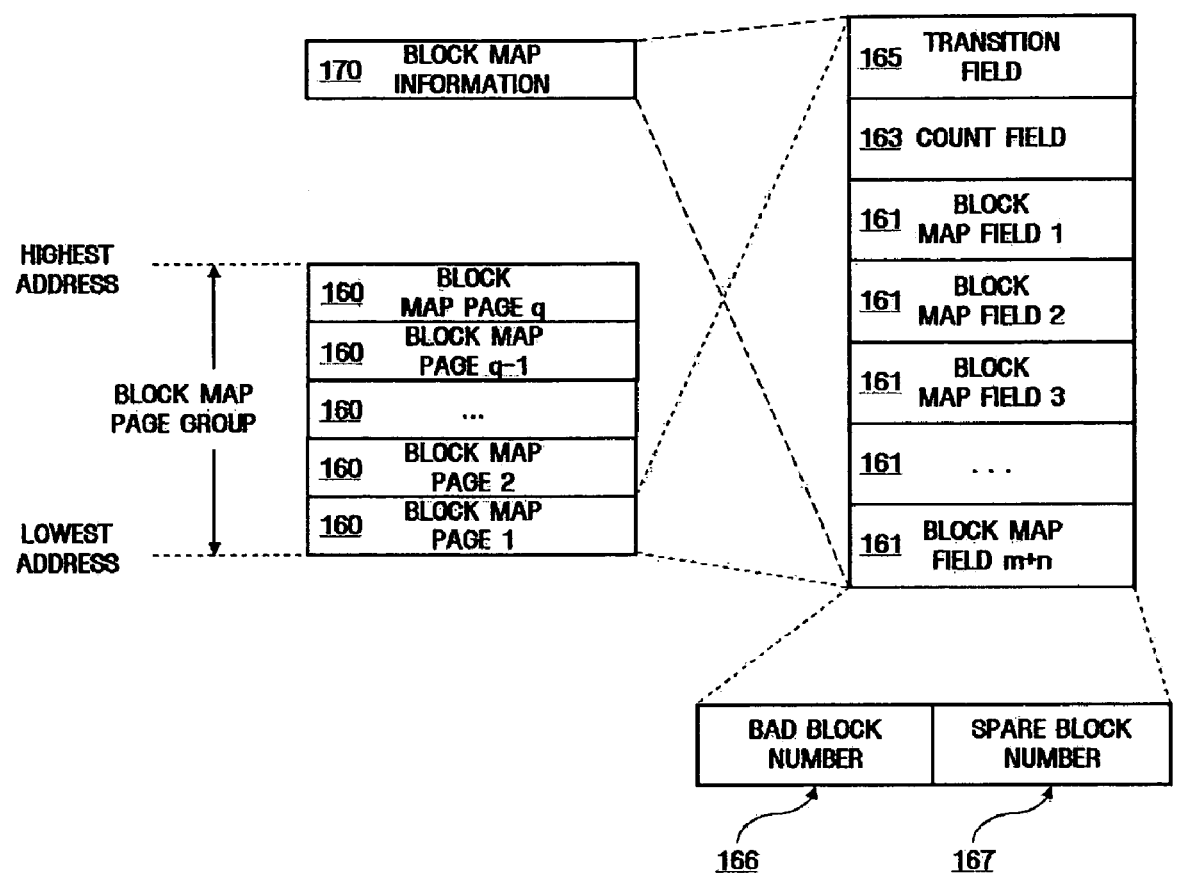
FIG. 13 is a block diagram illustrating a full structure of a block map page block.

FIG. 13 is a block diagram illustrating a full structure of a block map page group 150 or 158. The block map page group comprises q block map pages 160, each of which has (m+n) block map fields 161 comprising a bad block number 166 and a spare block number 167 to replace the bad block, equivalent to the number of the spare blocks 154 or 155. Namely, a block map page 160 contains mapping information to map bad blocks into spare blocks to replace them. The block map page 160 also comprises a count field 163 to determine whether the block map page 160 itself has been written last, and a transition field 165 to identify whether the block map field 161 information held by itself is valid, invalid or in no use. In an exemplary embodiment, the latest written block map page 160 has the largest numeral written on the count field 163 among block map pages 160 having valid indications, and the block map information 170 refers to the block map page 160 loaded onto the main memory, for example, RAM. Updating the block map page group through the block map information 170 will be described later. According to an exemplary embodiment of the present invention, a bad block number 166 and a spare block number 167 both comprise two (2) bytes, and a flash memory currently available in commerce has less than a total of 10,000 blocks, the number of which is sufficient since 2 bytes can have the numerals from 0 to 65535. According to an exemplary embodiment of the present invention, the count field 153 also has two (2) bytes and a flash memory currently available in commerce has less than a total of 10,000 blocks. The percentage of bad blocks liable to be generated during the use of a flash memory with respect to the total number of blocks is a several percent and thus the total number thereof is sufficient since 2 bytes can have the numerals from 0 to 65535.

Among the flash applications in the main memory 400 of FIG. 3, an authenticated flash application 412 transfers a semi-physical address to a flash device manager 420 so as to access a certain used block of the used area 110 and the flash device manager 420 finds a block having the physical address matching the semi-physical address. At this time, to prevent any bad block from being used, if the used block number in the block map field 161 registered in the block map information 170 of the block page 160 containing the latest bad block information is identical to the bad block number 166, the spare block of the spare block number 167 to replace the bad block of the bad block number is used.

Figure 14:
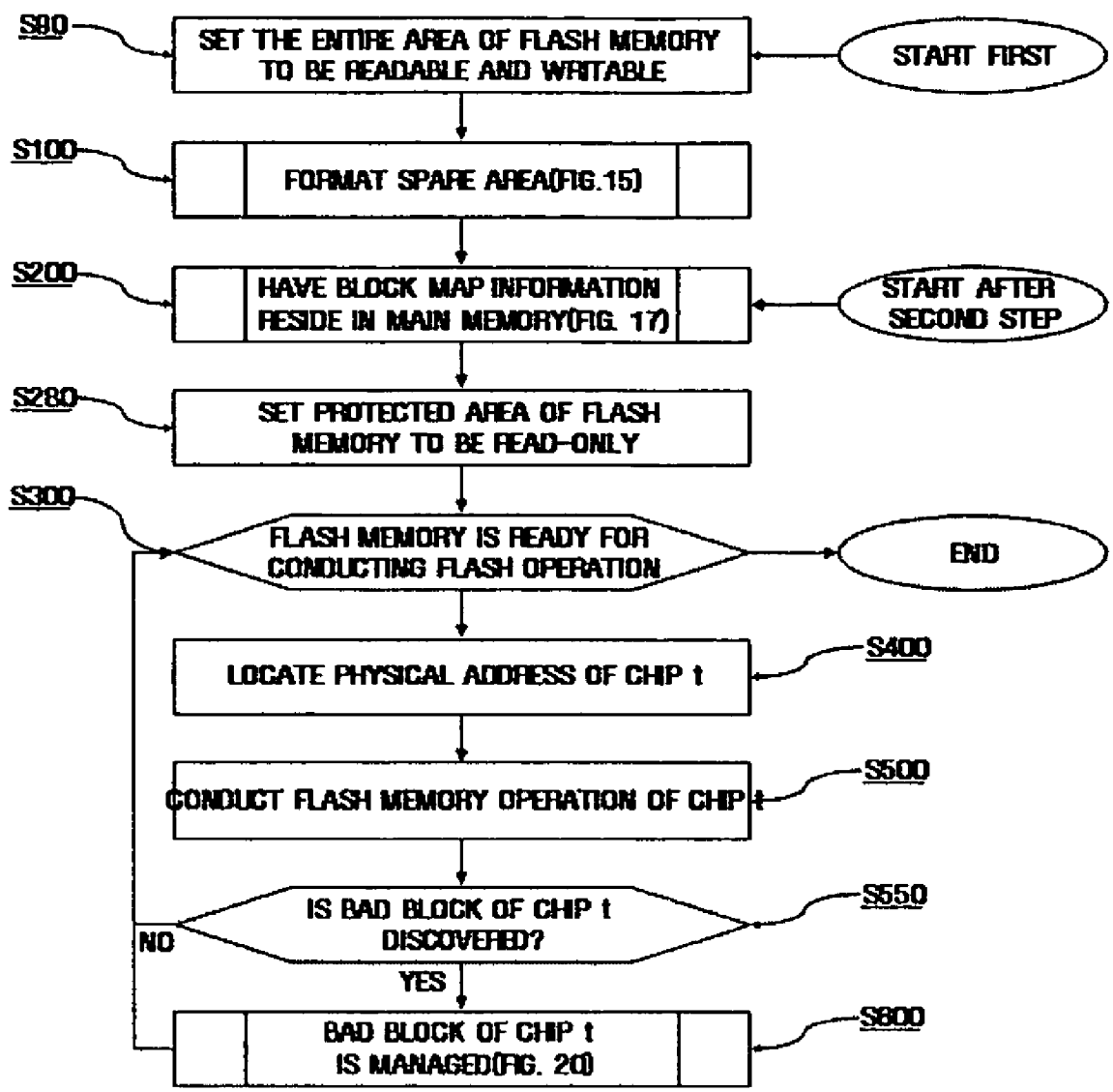
FIG. 14 is a flow chart illustrating an operation of a flash device manager for a flash memory.
Figure 15:
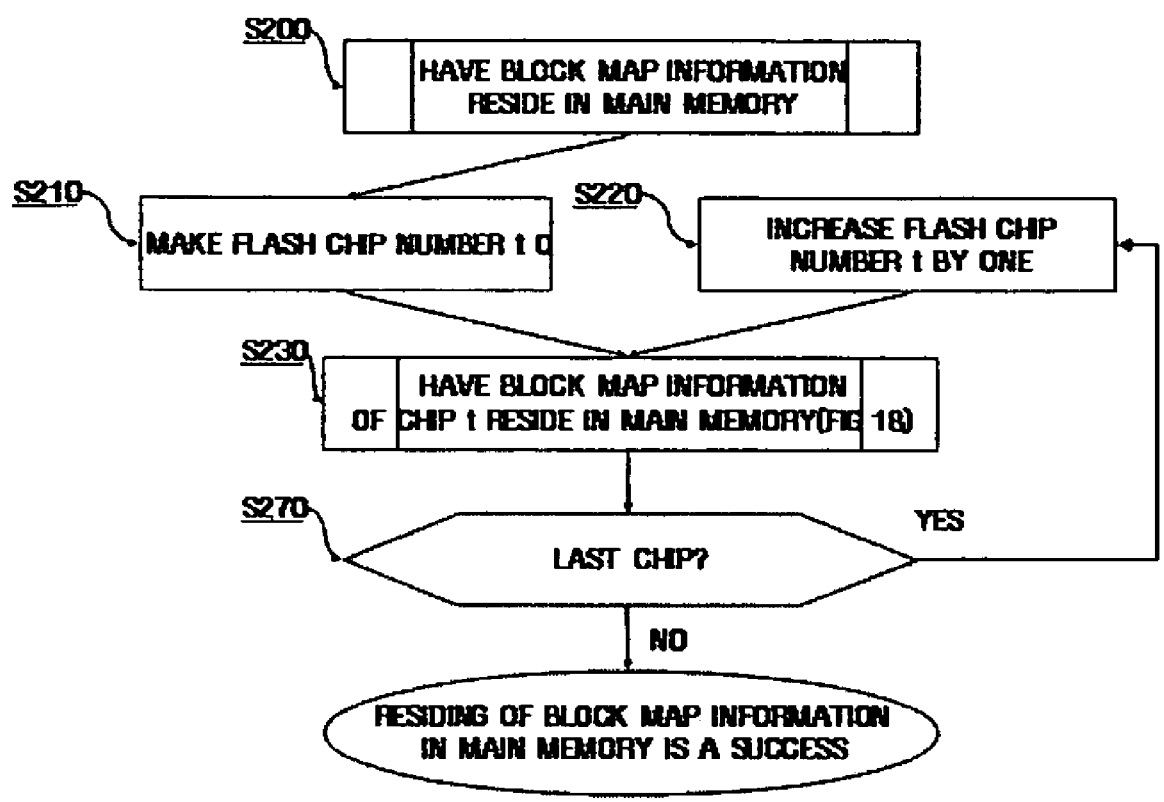
FIG. 15 is a flow chart illustrating formatting of a spare area in full.
Figure 16:
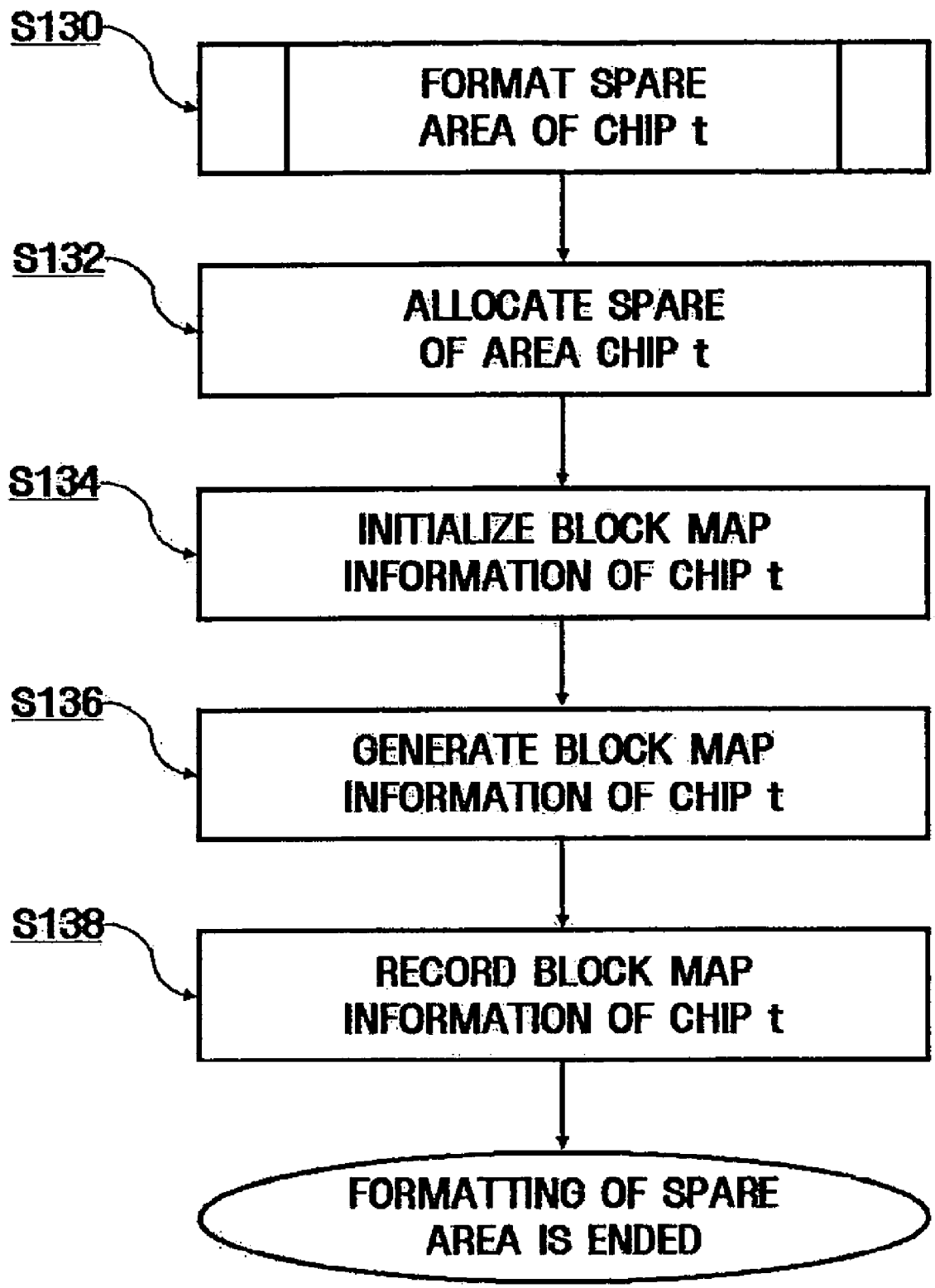
FIG. 16 is a flow chart illustrating formatting of a spare area of a chip in detail, among the processes for spare area formatting.
Figure 17:
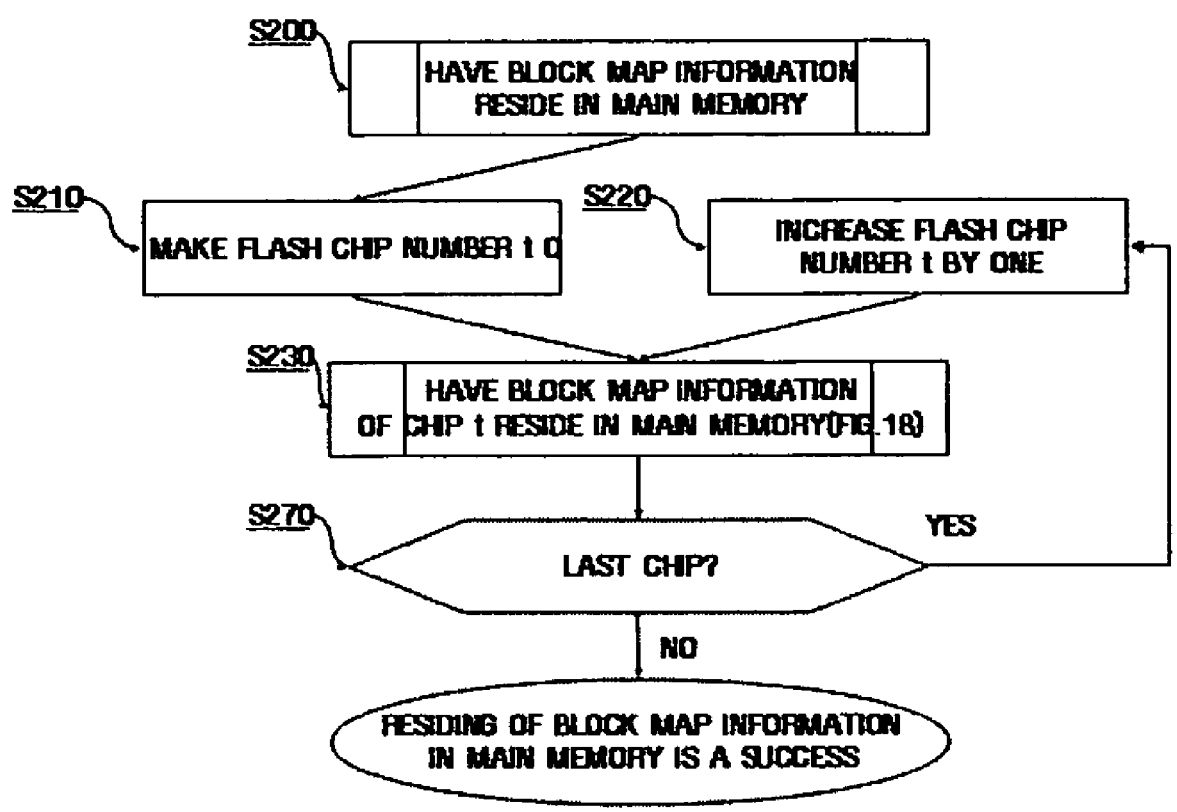
FIG. 17 is a flow chart illustrating residing of block map information in a RAM in detail.
Figure 18:
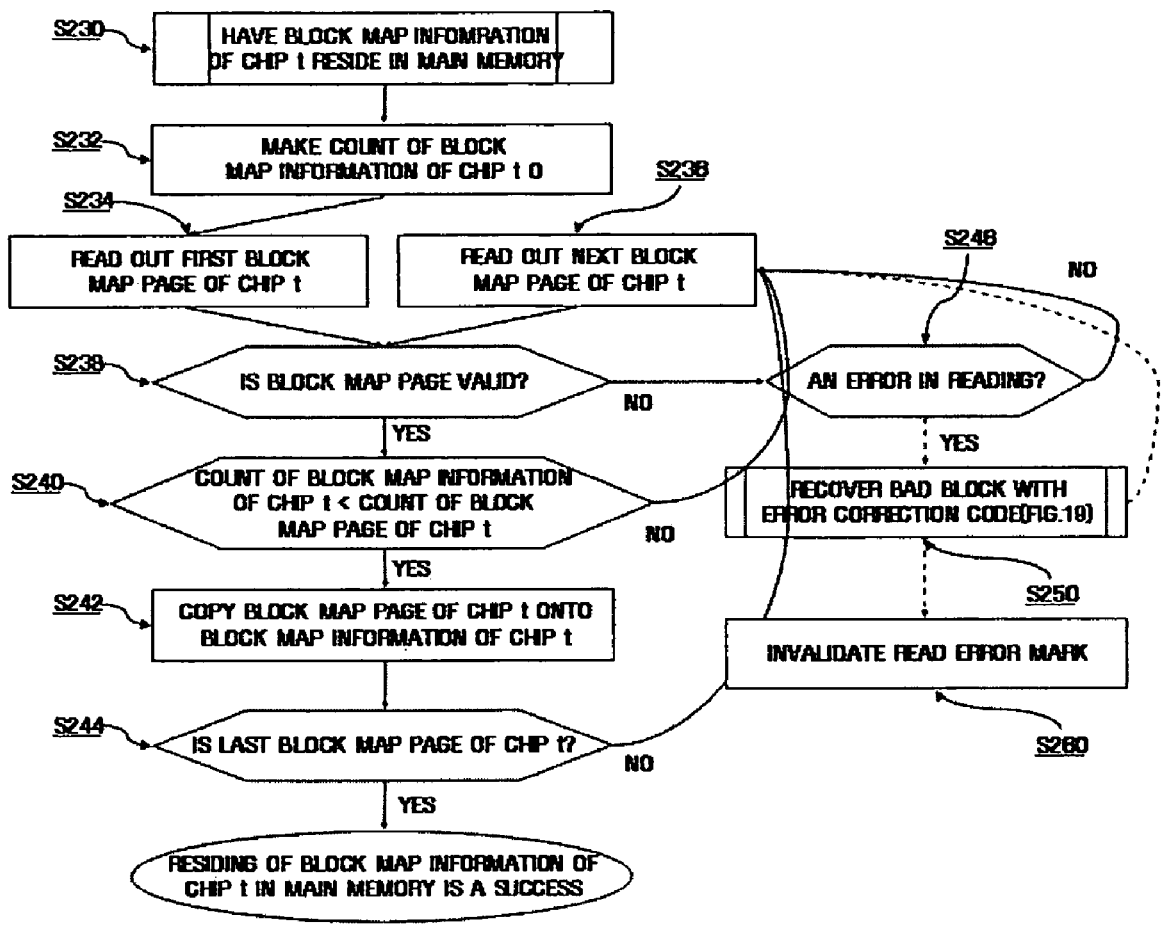
FIG. 18 is a flow chart illustrating residing of block map information for a chip in more detail.
Figure 19:
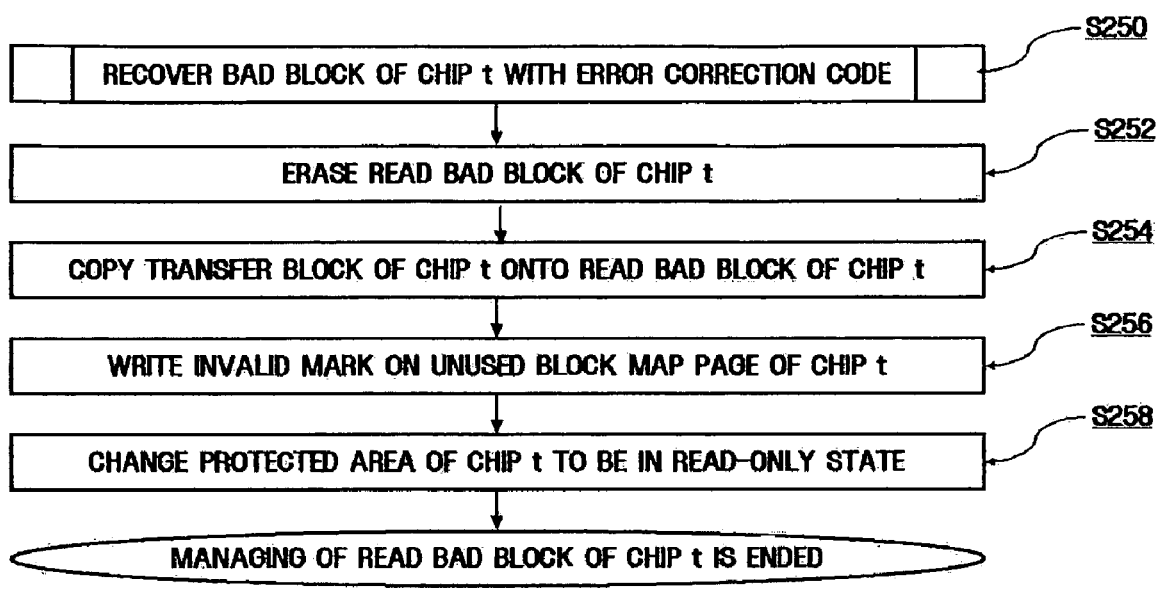
FIG. 19 is a flow chart illustrating recovering of write bad blocks of a chip #t with an error correction code.
Figure 20:
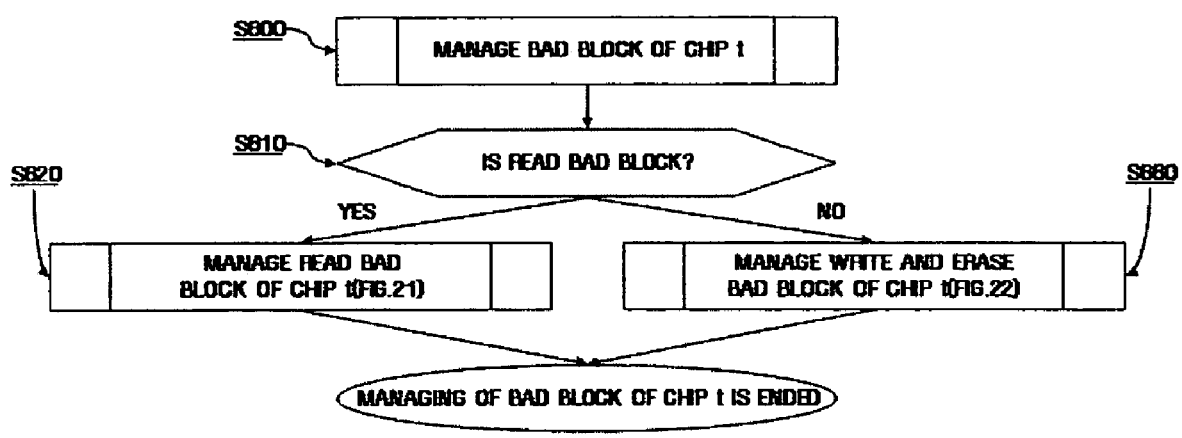
FIG. 20 is a flow chart illustrating handling of bad blocks in more detail.
Figure 21:
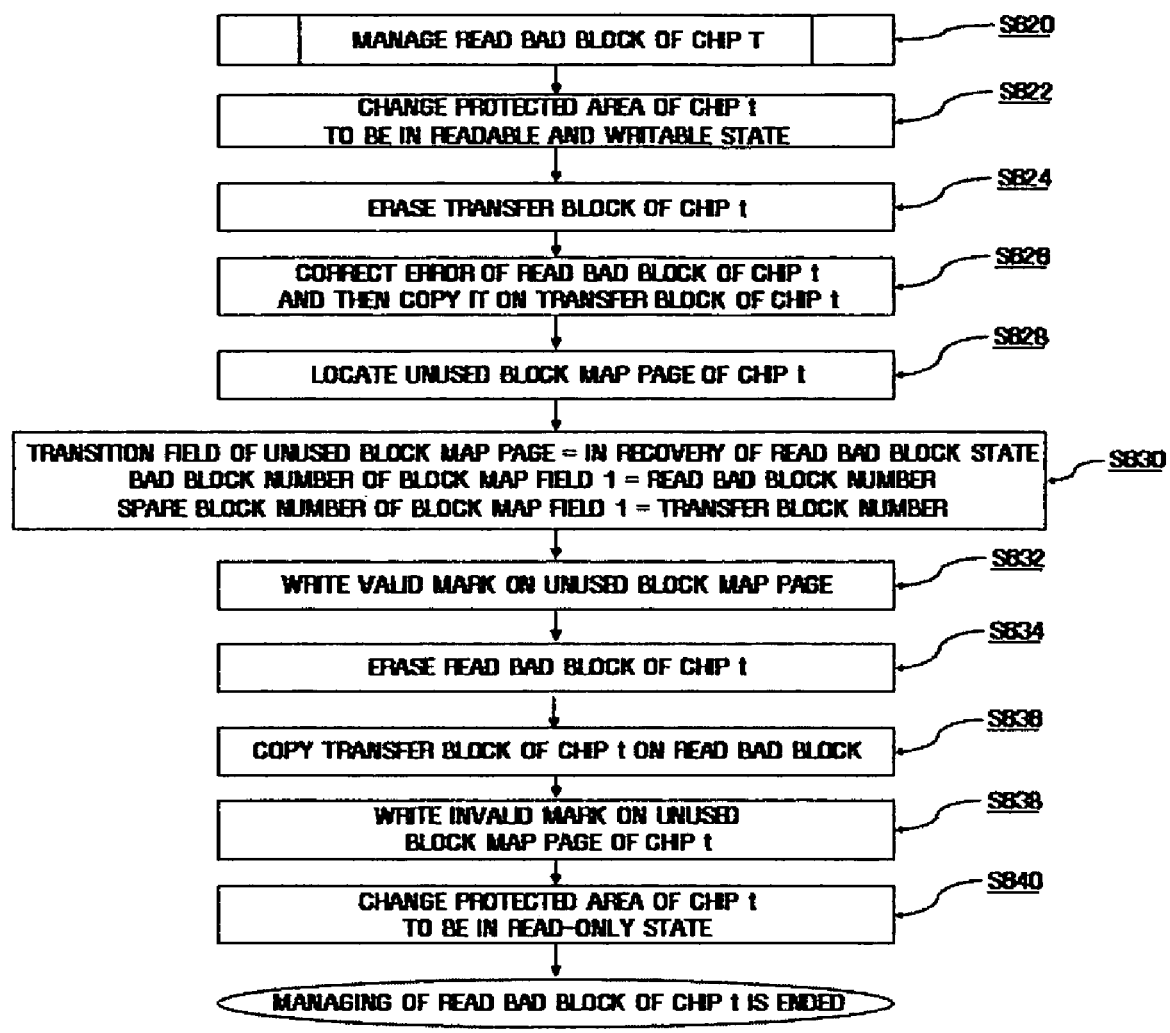
FIG. 21 is a flow chart illustrating handling of read bad blocks in more detail.
Figure 22:
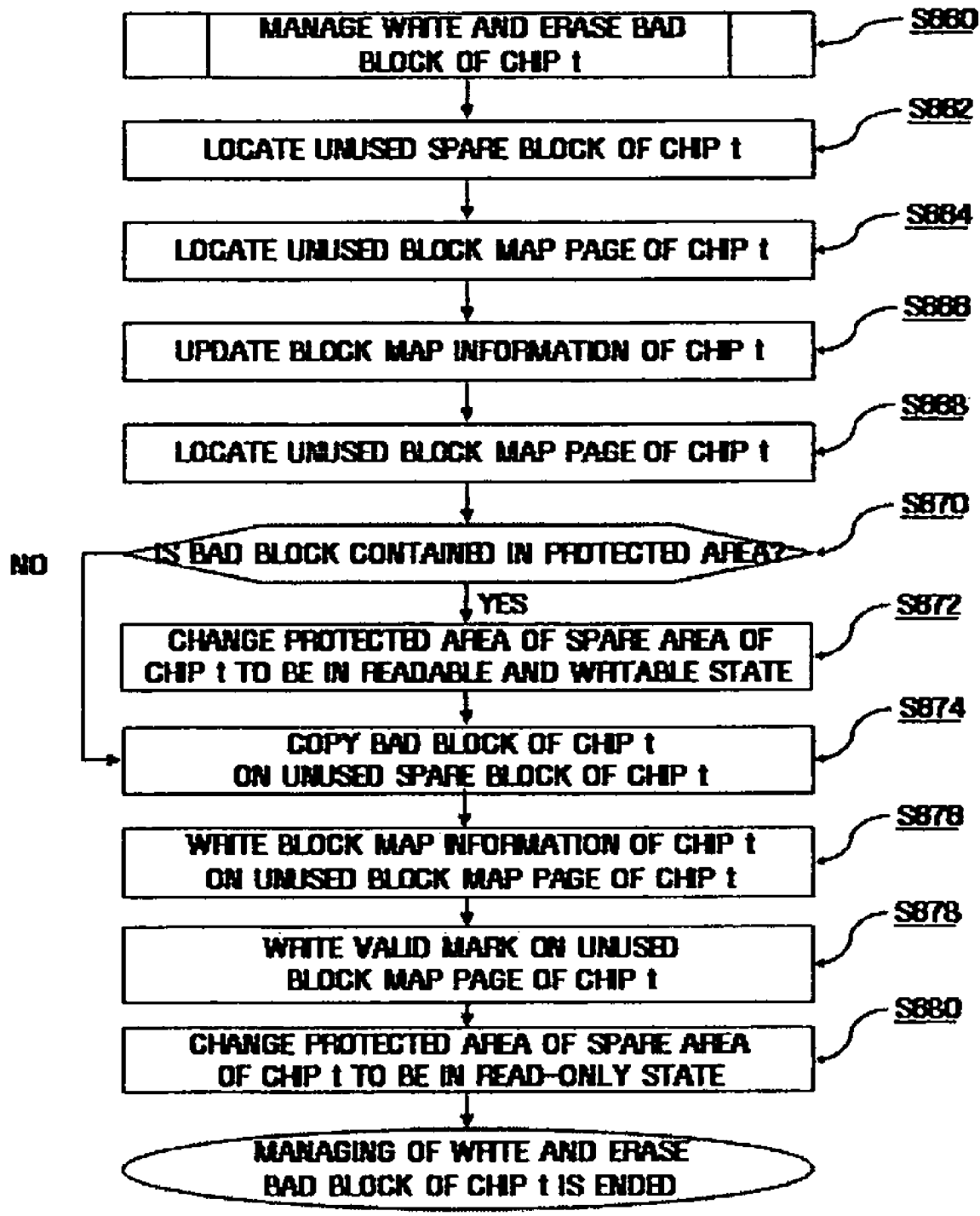
FIG. 22 is a flow chart illustrating handling write and erase bad blocks in more detail.

FIG. 14 is a flow chart illustrating an operation of a flash device manager for a flash memory. FIGS. 15 and 16 are flow charts illustrating formatting of a spare area in more detail, FIGS. 17, 18, 19 are flow charts illustrating having block map information reside in a RAM in more detail, FIGS. 20, 21 and 22 are flow charts illustrating the handling of bad blocks in more detail.

At first, the entire area of a flash memory is set to be readable and writable (S90) and then a spare area format is processed so as to divide the flash memory area into a used area and a spare area and to create a block map page group in the spare area (S100). Steps S90 and S100 may be required only at an initial stage. The spare area format process (S100) will be described with reference to FIGS. 15 and 16.

In spare area format process (S100), a flash chip number t is initialized as 0 (S110). After executing spare area formation of the chip t (t=0) (S130), the flash device manager inspects whether it is the last chip (S170). If it is not the last chip, the flash device manger increases the flash chip number t by 1 (S120) and executes formation of the next chip. The spare area formation is terminated when all the chips are formatted.

To format a spare area of the chip t (S130), a certain area of the chip is first allocated as a used area and the other area thereof is allocated as a spare area of the chip t in order to be substituted for bad blocks generated during the use of a flash memory S132. The number of blocks to be allocated for the spare area is calculated from the sum of the maximum number of bad blocks liable to be generated during the use of the flash memory and the number of blocks for managing the bad blocks generated. The former is the number of collection of spare blocks allocated and the latter may correspond with the sum of the number of the blocks of block map page groups, the number of transfer blocks and the number of the partition information blocks. The numerals of blocks to manage bad blocks may be allocated in the following manner. Where a chip is divided into a protected area and a unprotected area, two blocks are allocated for a protected block map page group and a unprotected block map group page, respectively. Where a chip is used only with a unprotected area, two blocks are allocated only for the unprotected block map page group. The reason why two blocks are allocated to each of the block map page group will be described later.

Where partition information is stored in a chip, one partition information block may be allocated. Further, a block generating a read error is reused, in lieu of being replaced with a spare block, and one transfer block required for this is allocated. The following table indicates the total number of blocks.

TABLE 1

Total number of blocks to be allocated for managing bad blocks

| Unprotected/ protected area supported | Unprotected area supported | Transfer block supported | Partition information block supported | Total number of blocks allocated |
|---|---|---|---|---|
| ○ | | ○ | ○ | 6 |
| ○ | | ○ | | 5 |
| ○ | | | ○ | 5 |
| ○ | | | | 4 |
| | ○ | ○ | ○ | 4 |
| | ○ | ○ | | 3 |
| | ○ | | ○ | 3 |
| | ○ | | | 2 |

Figure 1:
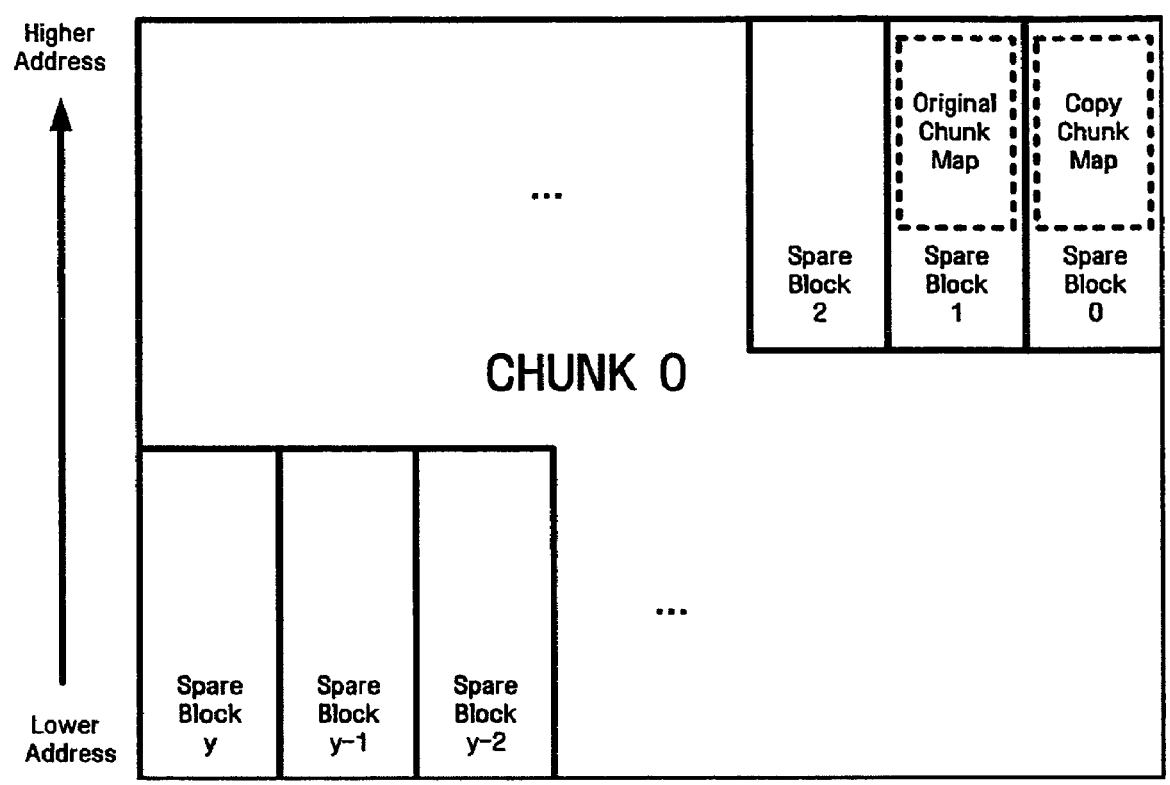
FIG. 1 is a block diagram illustrating a structure of a chunk as a basic unit for management of bad blocks.
Figure 2:
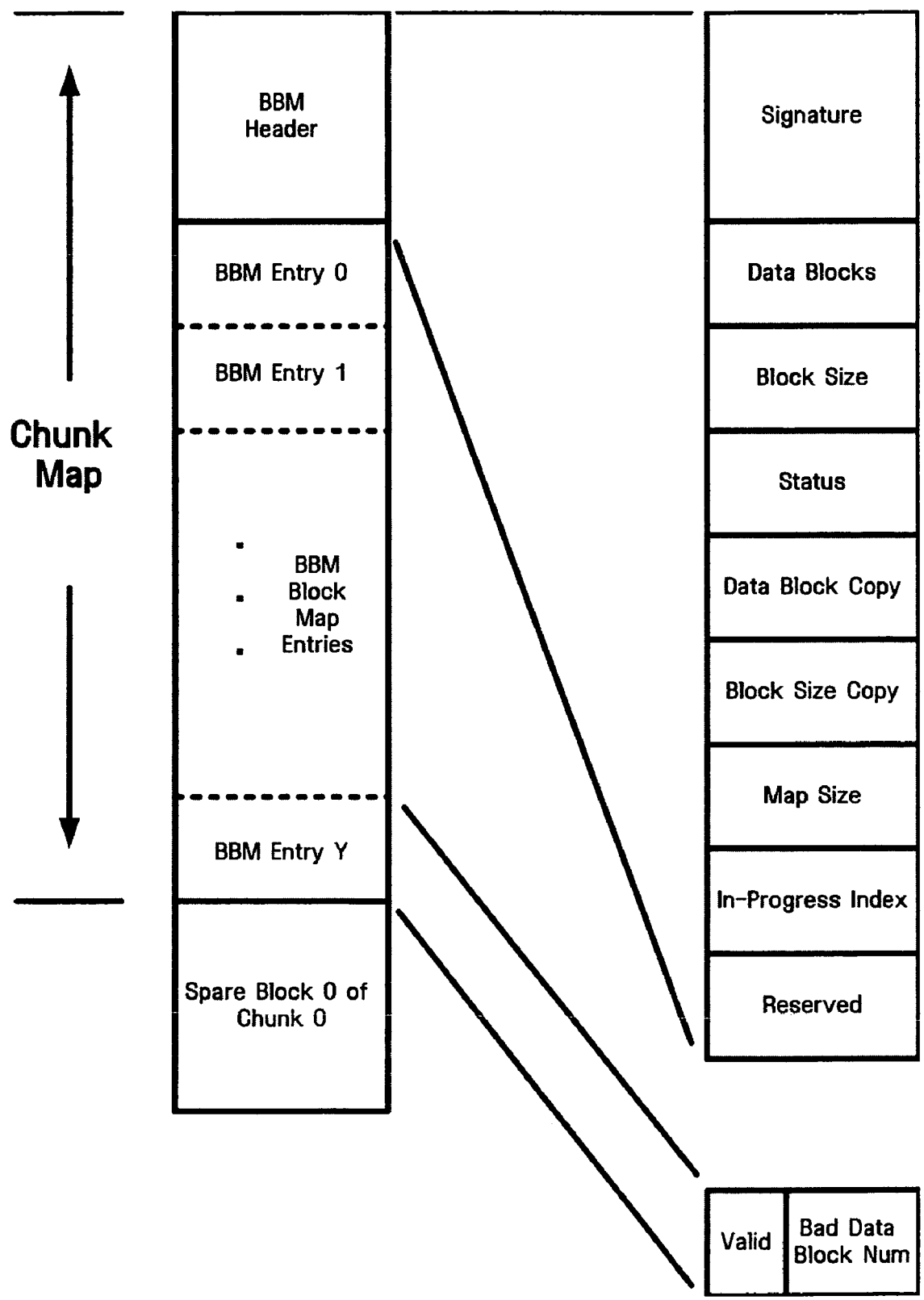
FIG. 2 is a block diagram illustrating a full structure of a chunk map in FIG. 1.

When spare area allocation of the chip t is completed (S132), the block map information of the chip t is then initialized (S134). The block map information of each chip is contained in the flash device manger residing in the main memory 400 of FIG. 1, basically comprising the same information as in the latest block map page stored in the block map page group of each chip. When the flash memory is used for the first time, the block map information is initialized so as to generate the block map information. Initialization of the block map information of the chip t (S134) means determination of the size of the block map information and initialization of each field its specified value. The size of the block map information may be determined by the addition of the size of transition field 165, the size of count field 163 and the size of a block map field and then multiplication of the result by the number of spare blocks {(transition field size+count field size+block map field size)*number of spare blocks}. In view of the initial values of each field, the transition field 165 has a valid indication, and the count field 163 has 1 which means that the block map information has been recorded at first. To initialize the bad block number 166 and the spare block number 167 of the block map field 161, the maximum values which can be represented from the bad block numbers 155 and the spare block numbers 167 are recorded as the bad block numbers 166 and the spare block numbers of each block map field 161, to thereby make all the block map fields 161 unused block map fields. In an exemplary embodiment of the present invention, the space for recording the bad block number 166 and the spare block number 167 has two bytes because the total number of blocks in a flash memory currently available in commerce is less than 10,000. Namely, the maximum value of each block number (166 or 167) is 65,545, which is sufficient to indicate the number of unused blocks.

When the block map information of the chip t is initialized (S134), the block map information of the chip t is generated on this basis (S136). To generate the block map information, it should be inspected whether any bad block exists in the chip t starting from the lowest to highest addresses. Once any bad block is found, an unused block map field is found from the block map field of the chip t. And then a bad block number 166 and a spare block number 167 of the unused block map fields are written with the bad block number found and the spare block number to substitute for the bad block number found, respectively. To find the unused block map field, the block map field 161 to the (m+n)th block map field 161 are inspected, and an unused block map field first found during the inspection is taken as the unused block map field.

Where the flash memory is divided into a protected area and an unprotected area, block map information on each of the areas (namely, protected block map information and unprotected map information) may be generated, but a single block map information may be generated. If the block map page group is used in an integrated manner although the flash memory is divided into the protected area and the unprotected area, a single block map information can be generated.

The block map information generated is recorded on the block map page group of the spare area of the chip t (S138). For recordation, erase operations are done on all the blocks belonging to the block map page group and then the block map information of the chip t is recorded on the block map page having the lowest address of the block map page group.

After spare area format process is completed (S100), the block map information resides in the main memory (S200). If the flash memory is not used for the first time, the block map information of each chip inspects the latest block map page from each chip and resides them in the main memory so as have the same information as in the block map page of each chip finally recorded.

How to have the block map information reside in the main memory will be described with reference to FIGS. 17, 18 and 19. The flash chip number t is first initialized as 0 (S210) and the latest block map information of the chip t becomes resident in the main memory (S230). Then, it is determined whether or not the concerned chip is the last chip (S270). If it is not the last chip, the flash chip number t is increased by 1. In this manner, this process is repeated until the block map information for the last chip becomes resident in the main memory.

To have the block map information of the chip t reside in the main memory (S230), 0 is first recorded on the count filed of the block map information of the chip t so as to initialize the count field (S232). The first block map page is read out from the block map page group of the chip t (S234). The validity of the read block map page is inspected (S238). If this is a valid block map page, the count of the block map information of the chip t is compared with the count of the read block map page (S240). When the count of the block map information of the chip t is less, this means that information of this read block map page is newer than the block map information of the chip t. Thus, the read block map page is copied onto the block map information of the chip t, to thereby update the block map information of the chip t (S242) with the newer information. If the read block map page is the last (S244), the information stored in the block map information of the chip t is the newest block map information, and thus, it becomes resident in the main memory. If the read block map page is not the last block map page, the next block map page of the chip t is read out so as to find existence of the newer block map page (S236). Then, the above-described processes are repeated. In the step of inspecting whether or not the block map page of the chip t is valid (S238), if it is not valid, the block map page is ignored and the next block map page of the chip t is read out (S236). Then, the above-described processes are repeated. Where a read error is treated differently from a write or erase error, processes to manage the read error (S246, S250 and S260) are added. In the valid block map page inspection (S238), if the block map page is marked with "In Recovery of Bad Block with Read Error" (S246), the read error is recovered (S250) and the Read Error mark on the block map page is invalidated (S260). Then, the next block map page is read out (S236). However, where it is neither a valid block map page nor a read error, the block map page is not valid and thus, the next block map page is read out. The next block map page is read out (S236) and the above processes (S238 to S244) are then repeated. Recovery of bad blocks causing the read error will be described in more detail with reference to FIG. 19.

The bad block of the chip t having caused a read error is first erased (S252). The read error in the course of having the block map information reside in the main memory may be found when power supply is resumed, where the bad blocks with read error had been in recovery after marking "In Recovery of Bad Block with Read Error" but power supply is abruptly interrupted. After erasing the bad block with read error S252, the transfer block of the chip t is copied on the bad block with read error S254 and an Invalid mark is applied to the found block map page (S256). Then the protected area of the chip t is changed in the read-only state (S258).

If the block map information resides in the main memory (S200), the protected area of the flash memory is set to a read-only area, whereby the flash memory is in a ready state of making a flash operation S300. The flash application 410 of the main memory 400 in FIG. 3 transfers the semi-physical address to the flash device manager so as to make a flash operation for a specific address of the used area and the flash device manger generates the physical address based on the concerned semi-physical address. If the physical address is found (S400), the flash operation is made (S500). If a bad block is found during the flash operation, mapping information is registered so as to allow a spare block, not a bad block, to use the concerned semi-physical address and a job to correct the error is done (S600). Handling of the bad block will be described with reference to FIGS. 20 to 22. If the bad block with read error is treated differently from the bad block with write or erase error, it is inspected whether the bad block of the chip t has a read error S610. If the bad block has a read error, the bad block of the chip t with read error is managed (S620). If not, the bad block with write or erase error is managed (S660). If the bad block with read error is treated as same as the bad block with write or erase error, write or erase operations are done all for the bad blocks of the chip t (S660).

Referring to FIG. 21, in handling of the read bad block of the chip t (S620), the protected area of the chip t is changed to be in the readable and writable state (S622). The transfer block of the chip t is erased (S624), the error of the read bad block of the chip t is corrected and then it is copied onto the transfer block of the chip t (S626). If any error is caused less than the predetermined bits, the error can be corrected with an error correction code. At this time, an unused block map page of the chip t is found (S628). Where there is no unused block map page, an erase operation is done onto the other block than the block containing the newest block map page. After one (1) is added to the count field of the block map information, the block map information of the chip t is recorded on the unused block map page at the lowest address of the erased block, and a valid mark is applied to the block map page. An unused block page may be found among upper block map pages of the block map page. A transition field of the found block map page is changed to be in "In recovery of read bad block," the read bad block number is recorded on the bad block number of the block map field 1, the transfer block number is recorded on the spare block number of the block map field 1 (S630), and a valid mark is applied to the found block map page (S632). Then, the read bad block of the chip t is erased (S634), the transfer block of the chip t is copied onto the read bad block, and an invalid mark is written onto the found block map page of the chip t (S638). At this time, the protected area of the chip t is changed to be in "read-only" state (S640).

The step S630 to indicate "In recovery of read bad block" is to provide for any abrupt suspension of power supply during the recovering process following step S532. The invalid mark is to indicate that the block map page checked with its red bad block is invalid since the page can be normally used after step S630. In an inspection of a valid block map page of FIG. 18 (S238), if it is the block map page marked with "In Recovery of Read Bad Block" (S246), the read bad block number is obtained from the bad block number 166 included in the block map field 1 of the block map page so as to recover the read error through steps S632, 634, 636 and 638. It has been described that a read error has mainly been caused in protected area. However, even when the read error is in unprotected area, the steps other than S622 and S640 can be performed in the same manner so as to manage a read bad block.

Referring to FIG. 22, in handling a write and erase bad block of the chip t (S660), an unused spare block of the chip t is first found (S662). The unused spare block can be found by use of the block map page information of the chip t in the following manner.

When a bad block is generated in a protected area of the chip t, an unused spare block is found by referring to the bad block number 166 with which a spare block is mapped with a bad block already generated among the block fields registered on the block map information of the chip t. In an exemplary embodiment of the present invention, where a bad block already generated is mapped into a spare block, an unused spare block is found starting from spare blocks having the highest to the lowest numbers. Where a bad block is generated in the unprotected area of the chip t, an unused spare block is found by referring to the bad block number 166 mapped into a spare block relative to the bad block already generated. In another exemplary embodiment of the present invention, where a bad block already generated is mapped into a spare block, an unused spare block is found starting from those spare blocks having the highest to the lowest numbers. When an unused spare block is found in this manner, it is advantageous because the spare block number can be used adaptively to the bad block generated, without allocating in advance the spare block numbers in the protected area and the unprotected area.

Once an unused spare block is found (S662), an unused block map field is found from the block map information of the chip t (S664). In steps S662 and 664, the block map field is found based on the block map information. Then, the block map information is updated (S666). Updating the block map information is writing the numbers of the spare block and the bad block for the bad block to be mapped into the spare block found from the block map information. A block map page writable in the block map page group is found after updating the block map information (S668), it is inspected whether the bad block is included in the protected area (S670) and if the bad block is included in the protected area, the protected area of the spare block of the chip t is changed to be in writable and erasable state (S672). However, where the found unused spare block is in the readable and writable unprotected area, step (S672) is not necessary. Herein, the unused block map page refers to any one block map page among the block map pages except for the block map page containing therein the newest information. Then, the bad block of the chip t is copied onto the unused spare block of the chip t (S674). Thereafter, the block map information of the chip t is written on the unused block map page of the chip t (S676), and a valid mark is written onto the unused block map page of the chip t (S678). Lastly, the protected area of the spare area of the chip t is changed into a read-only state (S680). A flash memory whose read block is replaced with a spare block can be used as if it has no bad blocks. To find the block map page written in step S668, it is determined whether it is valid by use of the transition field of the block map page and it is determined that the number of the count field among valid pages is the largest. Block map information is written on an empty block map page in step (S676). At this time, the count larger by one than the block map page having the largest number among the block map pages already stored is written on the count field. When there is no empty block map page, another block map page is found to write thereon. If the found page is also full, an erase operation is made to the other block having no newest block map page and then the information is written thereon.

For example, assuming that there are two blocks A and B, both of which have 10 block map pages. Where it is also assumed that the block map pages are written starting from the lowest to highest addresses, the block map pages of B block start to be used after all the block map pages of A block are used. At this time, since the block map pages of each block have mapping information as recorded by their manufacturers, A and B blocks play a role as a kind of mapping information history block. Thus, when all of the A block are used and then all of the B block are used, A block is erased when a new bad block is generated and a block map page containing new mapping information is generated thereon. At this time, even though the system fails in operation or power supply thereto is abruptly suspended, the flash memory can be used without trouble because the latest mapping information at the least, except for the current mapping information, exists in the B block. When a flash operation needs to be made to the bad block in the future, the bad block can be newly mapped into a spare block and a block map page containing the mapping information can be created.

By the way, if a block map page group is formed only with a single block, the block map page may be erased to write information thereon when there is no empty block map page. However, the system fails in operation or power supply thereto is abruptly suspended while the concerned block map page is erased, the information existed therein disappears. Taking this into consideration, it is the most desirable for a flash memory to have two blocks.

As described above, a bad block of a flash memory can be managed with less flash memory operations even when the bad block is generated during the use of the flash memory, thereby improving the performance of the flash memory, unlike conventional flash memory.

Further, a new area allocated to replace a bad block generated in a protected area of the flash memory having an established area (protected area) can be established to be read-only, and thus, important data having no need to be changed can be securely managed.

The present invention is now described with reference to the accompanying drawings in which exemplary embodiments of the invention are shown. The present invention may, however, be embodied in many different forms and should not be construed as being limited to the exemplary embodiments set forth herein. Rather, these exemplary embodiments are provided so that this disclosure will be thorough and complete, and will convey the scope of various example embodiments of the invention to those skilled in the art. The like reference numerals used in the whole part of the specification designate the same elements.

Although the present invention has been described in connection with the exemplary embodiments of the present invention illustrated in the accompanying drawings, it is not limited thereto since those skilled in the art can make various modifications and changes without departing from the scope and spirit of the invention.

What is claimed is:

1. A method for managing a bad block in a flash memory, comprising:
    (a) allocating a used area comprising a plurality of used blocks and a spare area comprising a plurality of spare blocks in the flash memory, and providing a block map page group including a plurality of block map pages in which mapping information to map a bad block generated in either the used area or the spare area to a first spare block is disposed;
    (b) having the mapping information of the block map page selected by a predetermined rule, which belongs to a block map page group, reside in a main memory as resident mapping information; and
    (c) mapping the bad block generated during a flash operation to an unused spare block found through the resident mapping information, updating the resident mapping information as updated mapping information, and recording the updated mapping information in the block map page belonging to the block map page.

2. The method as claimed in claim 1, wherein step (a) comprises:
    (a1) allocating the used area comprising the plurality of used blocks and the spare area comprising the plurality of spare blocks in the flash memory;
    (a2) generating block map fields on each of the spare blocks, on which mapping information between the generated spare blocks and the bad blocks is to be generated as generated block map fields, and initializing block map information containing the generated block map fields, a count field for determining a time of the mapping information and a transition field for determining a validity of the block map field information;
    (a3) generating block map information by recording the mapping information of bad blocks found through an inspection of bad blocks existing in the flash memory and spare blocks to replace the bad blocks found and initially mounting the mapping information on the count field; and
    (a4) recording the block map information on any one of the block map pages belonging to the block map page group.

3. The method as claimed in claim 1, wherein the block map page group comprises at least two spare blocks.

4. The method as claimed in claim 1, wherein the flash memory comprises a plurality of chips and each of the steps (a)-(c) is performed for each of the plurality of chips.

5. The method as claimed in claim 1, wherein in step (a), at least a part of the used blocks and the spare blocks are designated as a protected area to block an unauthenticated software from accessing the protected area.

6. The method as claimed in claim 1, wherein in step (b), a valid block map page comprising a latest information-written block page is inspected among the block map pages within the block map page group and mapping information of the found block map page is resided in the flash memory.

7. The method as claimed in claim 6, wherein when the latest information-written block map page is inspected, an inspection is made based on a value recorded on a transition field of each block map page and the size of a number recorded on the count field.

8. The method as claimed in claim 6, further comprising recovering a read bad block discovered through a predetermined method, where an invalid block map page indicated with a read error is discovered while a valid block map page comprising the latest block map page is inspected among the block map pages belonging to the block map page group.

9. The method as claimed in claim 6, wherein when the flash memory comprises a plurality of chips, each of the steps (a)-(c) is performed for each of the plurality of chips.

10. The method as claimed in claim 1, wherein step (c) comprises:
    (c1) locating an unused spare block by a use of the resident mapping information;
    (c2) updating the resident mapping information by mapping a number of the unused spare block found through step (c1) with a number of the bad block, as updated mapping information;
    (c3) locating an unused block map page of the block map page group as a found unused spare block;
    (c4) copying information recorded on the generated bad block on the found unused spare block;
    (c5) recording information including the updated mapping information on the found unused block map page; and
    (c6) indicating that the found unused block map page is valid.

11. The method as claimed in claim 10, further comprising changing the protected area to be in a readable and writable state when the bad block is generated in the protected area and again changing the protected area to be in a read-only state after completion of step (c6).

12. The method as claimed in either of claim 10, wherein when the flash memory comprises a plurality of chips, each of the steps (a)-(c) is performed for each of the plurality of chips.

13. The method as claimed in claim 1, wherein step (c) comprises:
    (c1) determining whether the bad block generated in the step (c) is a read bad block;
    (c2) erasing a spare block used temporarily to recover the read bad block;
    (c3) correcting an error of the read bad block and then copying the read bad block onto the spare block;
    (c4) locating an unused block map page among the block map page groups as a found block map page;
    (c5) indicating on the found block map page that the mapping information between the read bad block and the spare block is in recovery from a read error;
    (c6) erasing the read bad block as an erased read bad block;
    (c7) copying the spare block on the erased read bad block; and
    (c8) indicating on the found block map page that the found block map page is invalid.

14. The method as claimed in claim 13, wherein the protected area is changed to be in a readable and writable state when the bad block is generated in the protected area and the protected area is again changed to be in a read-only state after completion of step (c8).

* * * * *